US012813057B2

(12) United States Patent
Ma et al.

(10) Patent No.: US 12,813,057 B2
(45) Date of Patent: Nov. 24, 2026

(54) LIGHT-EMITTING SUBSTRATE, BACKLIGHT MODULE, AND DISPLAY APPARATUS

(71) Applicants: Hefei BOE Ruisheng Technology Co., Ltd., Hefei (CN); BOE TECHNOLOGY GROUP CO., LTD., Beijing (CN)

(72) Inventors: Yajun Ma, Beijing (CN); Jian Tian, Beijing (CN); Chunjian Liu, Beijing (CN); Jie Lei, Beijing (CN); Jianying Zhang, Beijing (CN)

(73) Assignees: Hefei BOE Ruisheng Technology Co., Ltd., Hefei (CN); Beijing BOE Technology Development Co., Ltd., Beijing (CN)

( * ) Notice: Subject to any disclaimer, the term of this patent is extended or adjusted under 35 U.S.C. 154(b) by 362 days.

(21) Appl. No.: 18/580,838

(22) PCT Filed: Dec. 2, 2022

(86) PCT No.: PCT/CN2022/136362
§ 371 (c)(1),
(2) Date: Jan. 19, 2024

(87) PCT Pub. No.: WO2024/113380
PCT Pub. Date: Jun. 6, 2024

(65) Prior Publication Data

US 2025/0228050 A1 Jul. 10, 2025

(51) Int. Cl.
*H10H 29/49* (2025.01)
*G02F 1/1335* (2006.01)
(Continued)

(52) U.S. Cl.
CPC ....... *H10H 29/49* (2025.01); *G02F 1/133603* (2013.01); *G02F 1/133612* (2021.01); *H10W 90/00* (2026.01)

(58) Field of Classification Search
CPC .............. H10H 29/49; G02F 1/133603; G02F 1/133612; G02F 1/133601;
(Continued)

(56) References Cited

U.S. PATENT DOCUMENTS

2019/0393245 A1 12/2019 Xi et al.
2021/0005631 A1 1/2021 Wang et al.
(Continued)

FOREIGN PATENT DOCUMENTS

CN 108490654 A 9/2018
CN 111092108 A 5/2020
(Continued)

OTHER PUBLICATIONS

Extended European Search Report for corresponding Application No. EP 22966966.8, dated Jul. 10, 2025, 7 pages.
(Continued)

*Primary Examiner* — Julia Slutsker
(74) *Attorney, Agent, or Firm* — Dority & Manning, P.A.

(57) ABSTRACT

A light-emitting substrate includes a substrate, functional element groups, signal line groups, first-type connecting lines and bonding pins. The functional element groups are arranged in rows in the first direction and in columns in a second direction: the first direction intersects with the second direction. A signal line group is electrically connected to a column of functional element groups, the signal line group includes at least one first-type signal line, and all first-type signal lines each extend in the first direction and are arranged at intervals in the second direction. A first-type connecting line is used to connect first-type signal lines
(Continued)

transmitting a same signal in at least two signal line groups. Among the first-type signal lines electrically connected to the first-type connecting line, at least one first-type signal line is spaced apart from the bonding pins.

20 Claims, 13 Drawing Sheets

(51) Int. Cl.
*G02F 1/13357* (2006.01)
*H10W 90/00* (2026.01)

(58) Field of Classification Search
CPC ......... G02F 1/133606; G02F 1/133611; G02F 1/133613; G02F 1/133614; G02F 2202/36; H10W 90/00; G09G 3/32; G09G 2300/0426
See application file for complete search history.

(56) References Cited

U.S. PATENT DOCUMENTS

| | | | | |
|---|---|---|---|---|
| 2021/0104573 | A1* | 4/2021 | Shan | H10H 29/142 |
| 2022/0068193 | A1* | 3/2022 | Wang | G09G 3/3233 |
| 2022/0130892 | A1 | 4/2022 | Dong et al. | |
| 2022/0165206 | A1 | 5/2022 | Zeng et al. | |
| 2023/0387139 | A1 | 11/2023 | Lei et al. | |
| 2024/0027833 | A1* | 1/2024 | Chen | G02F 1/133613 |

FOREIGN PATENT DOCUMENTS

| | | | |
|---|---|---|---|
| CN | 211457461 | U | 9/2020 |
| CN | 114093895 | A | 2/2022 |
| CN | 114721554 | A | 7/2022 |
| EP | 3786937 | A1 | 3/2021 |
| WO | WO2017103731 | A1 | 6/2017 |

OTHER PUBLICATIONS

PCT International Search Report (w/ English translation) and Written Opinion for corresponding Application No. PCT/CN2022/136362, dated Jul. 27, 2023, 10 pages.

* cited by examiner

LIGHT-EMITTING SUBSTRATE, BACKLIGHT MODULE, AND DISPLAY APPARATUS

CROSS-REFERENCE TO RELATED APPLICATION

The present application is a national phase entry under 35 USC 371 of International Patent Application No. PCT/CN2022/136362, filed on Dec. 2, 2022, which is incorporated herein by reference in its entirety.

TECHNICAL FIELD

The present disclosure relates to the field of display technologies, and in particular, to a light-emitting substrate, a backlight module, and a display apparatus.

BACKGROUND

Tiny light-emitting diodes, such as mini light-emitting diode (mini LED) and micro light-emitting diode (micro LED), whose size are less than 500 μm, have a significant increasing tendency to be used in the display field due to their advantages such as small size, ultra-high luminance and long service life.

SUMMARY

In one aspect, a light-emitting substrate is provided. The light-emitting substrate has a functional region and a bonding region spaced apart in a first direction. The light-emitting substrate includes: a substrate; a plurality of functional element groups located on a side of the substrate and located in the functional region, the plurality of functional element groups being arranged in a plurality of rows in the first direction and in a plurality of columns in a second direction, the first direction intersecting with the second direction; a plurality of signal line groups located in the functional region and located on a same side of the substrate as the plurality of functional element groups, a signal line group being electrically connected to a column of functional element groups; the signal line group including at least one first-type signal line, all first-type signal lines each extending in the first direction and being arranged at intervals in the second direction; a plurality of first-type connecting lines, a first-type connecting line being used to connect first-type signal lines transmitting a same signal in at least two signal line groups; and a plurality of bonding pins located in the bonding region. Among the first-type signal lines electrically connected to the first-type connecting line, at least one first-type signal line is spaced apart from the bonding pins.

In some embodiments, a functional element group includes at least one light-emitting device group. The at least one first-type signal line included in the signal line group includes at least one first voltage signal line, and the at least one first voltage signal line is electrically connected to the at least one light-emitting device group. The plurality of first-type connecting lines include at least one first connecting line, A first connecting line of the at least one first connecting line is electrically connected to the same ends of first voltage signal lines in at least two signal line groups.

In some embodiments, the first connecting line extends in the second direction and is located on a side of the functional region away from the bonding region.

In some embodiments, multiple light-emitting device groups in a same column of functional element groups are arranged in at least one column; a column of light-emitting device groups are electrically connected to a first voltage signal line of the at least one first voltage signal line.

In some embodiments, an orthogonal projection, on the substrate, of the column of light-emitting device groups electrically connected to the first voltage signal line at least partially overlaps with an orthogonal projection, on the substrate, of the first voltage signal line.

In some embodiments, the functional element group further includes a driver chip, and multiple driver chips in a same column of functional element groups are arranged in a column in the first direction: multiple light-emitting device groups in the same column of functional element groups are located on two opposite sides, in the second direction, of the multiple driver chips in the same column of functional element groups.

In some embodiments, the functional element group includes a driver chip. The at least one first-type signal line included in the signal line group includes a ground signal line, and the ground signal line is electrically connected to the driver chip. The plurality of first-type connecting lines include at least one second connecting line, and a second connecting line of the at least one second connecting line is electrically connected to the same ends of ground signal lines in at least two signal line groups.

In some embodiments, the second connecting line extends in the second direction and is located on a side of the functional region proximate to the bonding region.

In some embodiments, each functional element group includes a driver chip; the number of functional element groups in each column is N, and N driver chips in each column of functional element groups are cascaded in sequence. The signal line group further includes at least one second-type signal line, and all second-type signal lines each extend in the first direction and are arranged at intervals in the second direction. The light-emitting substrate further includes: a plurality of second-type connecting lines, a second-type connecting line being used to connect second-type signal lines transmitting a same signal in at least two signal line groups. Among the second-type signal lines electrically connected to the second-type connecting line, at least one second-type signal line is spaced apart from the bonding pins.

In some embodiments, all the second-type signal lines include multiple address signal lines, and any two adjacent driver chips of the N drive chips are cascaded through an address signal line. The plurality of second-type connecting lines include at least one third connecting line. In M columns of functional element groups, two driver chips respectively belonging to two adjacent columns of functional element groups are cascaded through a third connecting line of the at least one third connecting line, wherein M≥2, and M is a positive integer.

In some embodiments, the third connecting line is electrically connected to a first driver chip of one of two adjacent columns of N driver chips, and passes through a gap between the two adjacent columns of functional element groups to be electrically connected to an N-th driver chip of another of the two adjacent columns of N driver chips.

In some embodiments, the third connecting line extends in the second direction and is located on a side of the functional region away from the bonding region.

In some embodiments, all the second-type signal lines further include multiple second voltage signal lines, and a second voltage signal line is electrically connected to the driver chip. The plurality of second-type connecting lines further include at least one fourth connecting line. Among second voltage signal lines connected to M columns of N driver chips, at least two second voltage signal lines are connected through a fourth connecting line of the at least one fourth connecting line.

In some embodiments, the fourth connecting line extends in the second direction and is located on a side of the functional region proximate to the bonding region.

In some embodiments, the fourth connecting line is connected to two adjacent second voltage signal lines in the second voltage signal lines connected to the M columns of N driver chips. The fourth connecting line is electrically connected to a first end of one of the two adjacent second voltage signal lines, and passes through a gap between the two adjacent columns of functional element groups to be electrically connected to a second end of another of the two adjacent second voltage signal lines.

In some embodiments, all the second-type signal lines further include multiple data signal lines, and a data signal line is electrically connected to the driver chip. The plurality of second-type connecting lines further include at least one fifth connecting line. Among data signal lines connected to M columns of N driver chips, at least two data signal lines are connected through a fifth connecting line of the at least one fifth connecting line.

In some embodiments, the fifth connecting line extends in the second direction and is located on a side of the functional region proximate to the bonding region.

In some embodiments, the fifth connecting line is electrically connected to two adjacent data signal lines in the data signal lines connected to the M columns of N driver chips. The fifth connecting line is electrically connected to a first end of one of the two adjacent data signal lines, and passes through a gap between the two adjacent columns of functional element groups to be electrically connected to a second end of another of the two adjacent data signal lines.

In some embodiments, each functional element group includes at least one light-emitting device group, and a light-emitting device group of the at least one light-emitting device group includes a plurality of light-emitting devices. Light-emitting devices included in multiple light-emitting device groups are arranged in a plurality of rows in the first direction, and arranged in a plurality of columns in the second direction. Any two adjacent rows of light-emitting devices are arranged in a staggered manner.

In another aspect, a backlight module is provided. The backlight module includes the light-emitting substrate as described in any one of the above embodiments, and an optical film located on a light exit side of the light-emitting substrate.

In yet another aspect, a display apparatus is provided. The display apparatus includes the backlight module as described in any one of the above embodiments, and a color filter substrate located on a side of the array substrate away from the backlight module.

BRIEF DESCRIPTION OF THE DRAWINGS

In order to describe technical solutions in the present disclosure more clearly, the accompanying drawings to be used in some embodiments of the present disclosure will be introduced briefly; obviously, the accompanying drawings to be described below are merely drawings of some embodiments of the present disclosure, and a person of ordinary skill in the art can obtain other drawings according to those drawings. In addition, the accompanying drawings to be described below may be regarded as schematic diagrams, but are not limitations on actual sizes of products and actual processes of methods to which the embodiments of the present disclosure relate.

DETAILED DESCRIPTION

Figure 1A:
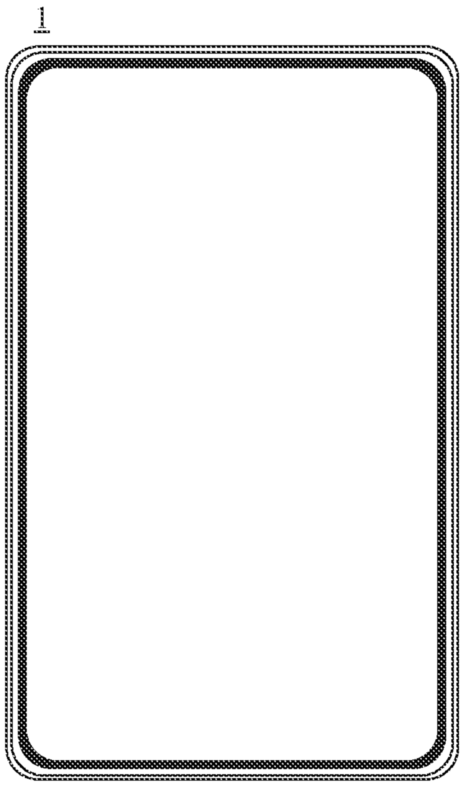
FIG. 1A is a structural diagram of a display apparatus, in accordance with some embodiments of the present disclosure.

The technical solutions in some embodiments of the present disclosure will be described clearly and completely with reference to the accompanying drawings; obviously, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term “comprise” and other forms thereof such as the third-person singular form “comprises” and the present participle form “comprising” are construed as an open and inclusive meaning, i.e., “including, but not limited to". In the description of the specification, the terms such as "one embodiment", "some embodiments" "exemplary embodiments", "example", "specific example", or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

The terms "first" and "second" are used for descriptive purposes only, and are not to be construed as indicating or implying a relative importance or implicitly indicating a number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the term "connected" and extensions thereof may be used. The term "connected" should be understood in a broad sense. For example, the term "connected" may represent a fixed connection, a detachable connection, or a one-piece connection, or may represent a direct connection, or may represent an indirect connection through an intermediate medium. For example, the term "connected" may be used in the description of some embodiments to indicate that two or more elements are in direct physical or electrical contact with each other. The embodiments disclosed herein are not necessarily limited to the content herein.

The phrase "A and/or B" includes the following three combinations: only A, only B, and a combination of A and B.

As used herein, the term "if" is, optionally, construed as "when" or "in a case where" or "in response to determining that" or "in response to detecting," depending on the context. Similarly, depending on the context, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]".

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values other than those stated.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views that are schematic illustrations of idealized embodiments. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

FIG. 1A is a structural diagram of a display apparatus according to some embodiments.

As shown in FIG. 1A, some embodiments of the present disclosure provide a display apparatus 1. In some examples, the display apparatus 1 may be a product having an image display function.

In some examples, the display apparatus 1 may be any apparatus that displays an image whether in motion (e.g., a video) or stationary (e.g., a still image), and whether textual or graphical, More specifically, it is expected that the embodiments may be implemented in or associated with a plurality of electronic devices. The plurality of electronic devices may include (but is not limit to), for example, mobile telephones, wireless devices, personal data assistants, hand-held or portable computers, global positioning system receivers/navigators, cameras, video players, video cameras, game consoles, watches, clocks, calculators, TV monitors, flat panel displays, computer monitors, car displays (e.g., odometer displays), navigators, cockpit controllers and/or displays, camera view displays (e.g., rear view camera displays in vehicles), electronic photos, electronic billboards or indicators, projectors, building structures, packagings and aesthetic structures (e.g., a display for an image of a piece of jewelry).

In some other examples, the display apparatus 1 may be a product having no image display function. For example, the display apparatus 1 may be a video panel or the like.

Embodiments of the present disclosure do not further limit the display apparatus 1, and the following will be described by taking an example in which the display apparatus 1 is a product having an image display function.

In some examples, the display apparatus 1 may be a liquid crystal display (LCD) apparatus.

Figure 1B:
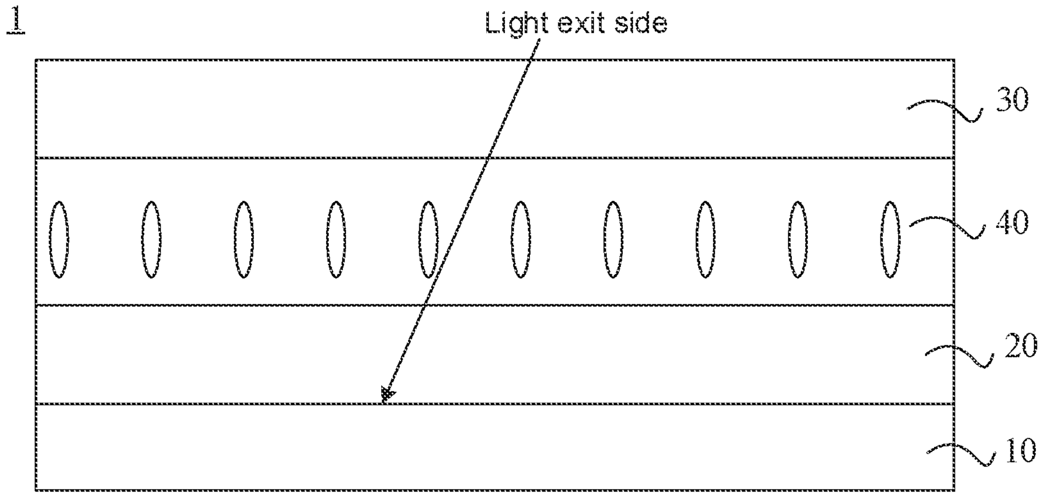
FIG. 1B is a structural diagram of another display apparatus, in accordance with some embodiments of the present disclosure.

In some examples, as shown in FIG. 1B, the display apparatus 1 includes a backlight module 10, an array substrate 20 located on a light exit side of the backlight module 10, and a color filter substrate 30 located on a side of the array substrate 20 away from the backlight module 10.

For example, the backlight module 10 may be used as a light source for providing backlight. For example, the backlight provided by the backlight module 10 may be white light or blue light.

For example, the light exit side of the backlight module 10 refers to a side where the backlight module 10 emits light.

For example, the array substrate 20 may include a plurality of pixel driving circuits and a plurality of pixel electrodes, and the plurality of pixel driving circuits are arranged in an array, for example. The plurality of pixel driving circuits are electrically connected to the plurality of pixel electrodes in one-to-one correspondence, and the pixel driving circuits each provide a pixel voltage for the respective pixel electrodes.

In some examples, in a case where the backlight provided by the backlight module 10 is white light, the color filter substrate 30 may include a red filter film, a green filter film and a blue filter film. By controlling the intensity of light irradiated on the red filter film, the green filter film and the blue filter film, different intensities of red light, green light and blue light can be obtained, so that the display apparatus 1 can display color images. For example, the red filter film can only transmit the red light in the incident light, the green filter film can only transmit the green light in the incident light, and the blue filter film can only transmit the blue light in the incident light.

In some other examples, in a case where the backlight provided by the backlight module 10 is blue light, the color filter substrate 30 may include a color conversion film. For example, the color conversion film may be a quantum dot film. After blue light is irradiated on the red quantum dot film, it can be converted into red light. After blue light is irradiated on the green quantum dot film, it can be converted into green light. The red light and green light converted by the quantum dot film are mixed with the blue light provided by the backlight module 10 to enable the display apparatus 1 to realize full-color image display.

For example, the display apparatus 1 further includes a common electrode. The common electrode may be disposed in the color filter substrate 30, and the common electrode may receive a common voltage. Alternatively, the common electrode may be disposed in the array substrate 20, which is not limited in the present disclosure.

In some examples, as shown in FIG. 1B, the display apparatus 1 further includes a liquid crystal layer 40 located between the color filter substrate 30 and the array substrate 20.

For example, the liquid crystal layer 40 includes multiple liquid crystal molecules. For example, an electric field may be created between the pixel electrode and the common electrode, and the intensity of the electric field created between the common electrode and each pixel electrode can be controlled by controlling the voltage value of each pixel electrode, thereby controlling the deflection angle of the liquid crystal molecules in the liquid crystal layer 40.

It will be understood that the backlight provided by the backlight module 10 can pass through the array substrate 20 and be incident on the liquid crystal molecules in the liquid crystal layer 40. Due to the action of the electric field created between the pixel electrode and the common electrode, the liquid crystal molecules are made to rotate, thereby changing the amount of light passing through the liquid crystal molecules, so that the light emitted through the liquid crystal molecules reaches a preset brightness. The light is emitted after passing through the filter films of different colors in the color filter substrate 30. The emitted light includes light of various colors, such as red light, green light and blue light, and the light of various colors cooperate with each other to make the display apparatus 1 realize the image display function.

For example, the backlight module 10 in the display apparatus 1 are various, which may be set according to actual conditions, which is not limited in the present disclosure.

For example, the backlight module 10 may be an edge-lit backlight module, or the backlight module 10 may be a direct-lit backlight module.

For the convenience of description, the following embodiments of the present disclosure will be described by taking an example in which the backlight module 10 is a direct-lit backlight module.

Figure 2:
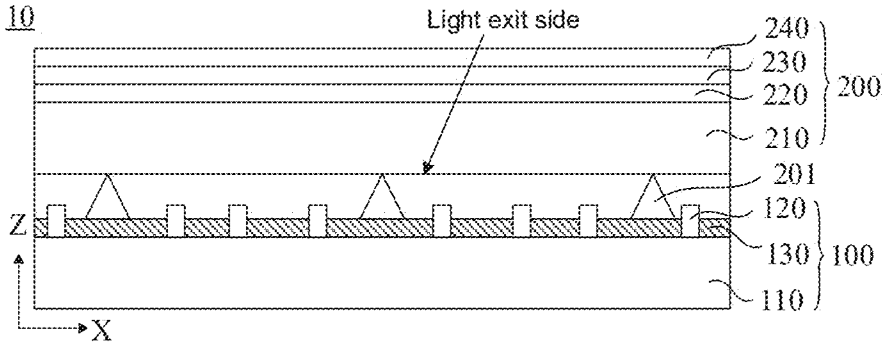
FIG. 2 is a structural diagram of a backlight module, in accordance with some embodiments of the present disclosure.

In some embodiments, as shown in FIG. 2, the backlight module 10 includes a light-emitting substrate 100 and an optical film 200 located on a light exit side of the light-emitting substrate 100.

For example, the optical film 200 includes a diffuser plate 210, a quantum dot film 220, a diffuser sheet 230 and a composite film 240 that are stacked in sequence on the light exit side of the light-emitting substrate 100.

For example, the diffuser plate 210 and the diffuser sheet 230 are used to eliminate lamp shadows and uniformize the light emitted by the light-emitting substrate 100 to improve the uniformity of the light.

For example, the quantum dot film 220 is used to convert the light emitted by the light-emitting substrate 100. Optionally, in a case where the light emitted by the light-emitting substrate 100 is blue light, the quantum dot film 220 can convert the blue light into white light and improve the purity of the white light.

For example, the composite film 240 is used to improve brightness of the light emitted by the light-emitting substrate 100.

It will be understood that after passing through the optical film 200, the brightness of the light emitted by the light-emitting substrate 100 is improved, and the emitted light has a high purity and good uniformity.

In some examples, as shown in FIG. 2, the backlight module 10 further includes support columns 201 arranged between the light-emitting substrate 100 and the diffuser plate 210 in the optical film 200.

For example, the support columns 201 may be fixed on the light-emitting substrate 100 by glue. The support columns 201 may be used to support the optical film 200, so that the light emitted by the light-emitting substrate 100 has a certain light mixing distance, so as to further eliminate lamp shadows and improve the uniformity of light.

For example, the display apparatus 1 further includes a frame, a display chip, and other electronic components.

In some other examples, the display apparatus 1 includes a light-emitting substrate 100, and the light-emitting substrate 100 is directly used for displaying images. The display apparatus is commonly used in commercial display, such as display screens in traffic management command centers or display screens in commercial plazas.

In some embodiments, as shown in FIGS. 3A to 3G and FIG. 4A, the light-emitting substrate 100 has a functional region F and a bonding region B.

The bonding region B and the functional region F are arranged in sequence in a first direction X. It will be noted that, in the accompanying drawings of the present disclosure, considering FIGS. 3A to 3G and FIG. 4A as examples, an edge of the functional region F and an edge of the bonding region B that are shown in dotted line boxes are spaced apart, which are merely for clearly distinguishing the functional region F and the bonding region B, and do not further limit the positions of the edges of the functional region F and the bonding region B.

For example, the bonding region B is a region where the light-emitting substrate 100 is bonded to the display chip.

For example, there are various shapes of the functional region F, which may be selected according to actual conditions, which is not limited in the present disclosure.

For example, the shape of the functional region F may be a rectangle, a circle, or the like.

For the convenience of description, the following will be described by taking an example in which the shape of the functional region F is a rectangle.

In some examples, the light-emitting substrate 100 includes a substrate 110, and a plurality of functional element groups 120.

The type of the substrate 110 varies, which may be set according to actual needs.

For example, the substrate 110 may be a flexible substrate or a rigid substrate.

For example, in a case where the substrate 110 is a flexible substrate, the flexible substrate may be, for example, a polyethylene terephthalate (PET) substrate, a polyethylene naphthalate two formic acid glycol ester (PEN) substrate, or a polyimide (PI) substrate.

For another example, in a case where the substrate 110 is a rigid substrate, the rigid substrate may be a glass substrate, a polymethyl methacrylate (PMMA) substrate, or the like.

For example, the plurality of functional element groups 120 are located on a side of the substrate 110, and the plurality of functional element groups 120 are located in the functional region F. The plurality of functional element groups 120 may be arranged in a plurality of rows in the first direction X, and arranged in a plurality of columns in a second direction Y. It will be understood that the plurality of rows of functional element groups 120 are arranged at intervals in the first direction X, and the plurality of columns of functional element groups 120 are arranged at intervals in the second direction Y.

Figure 3A:
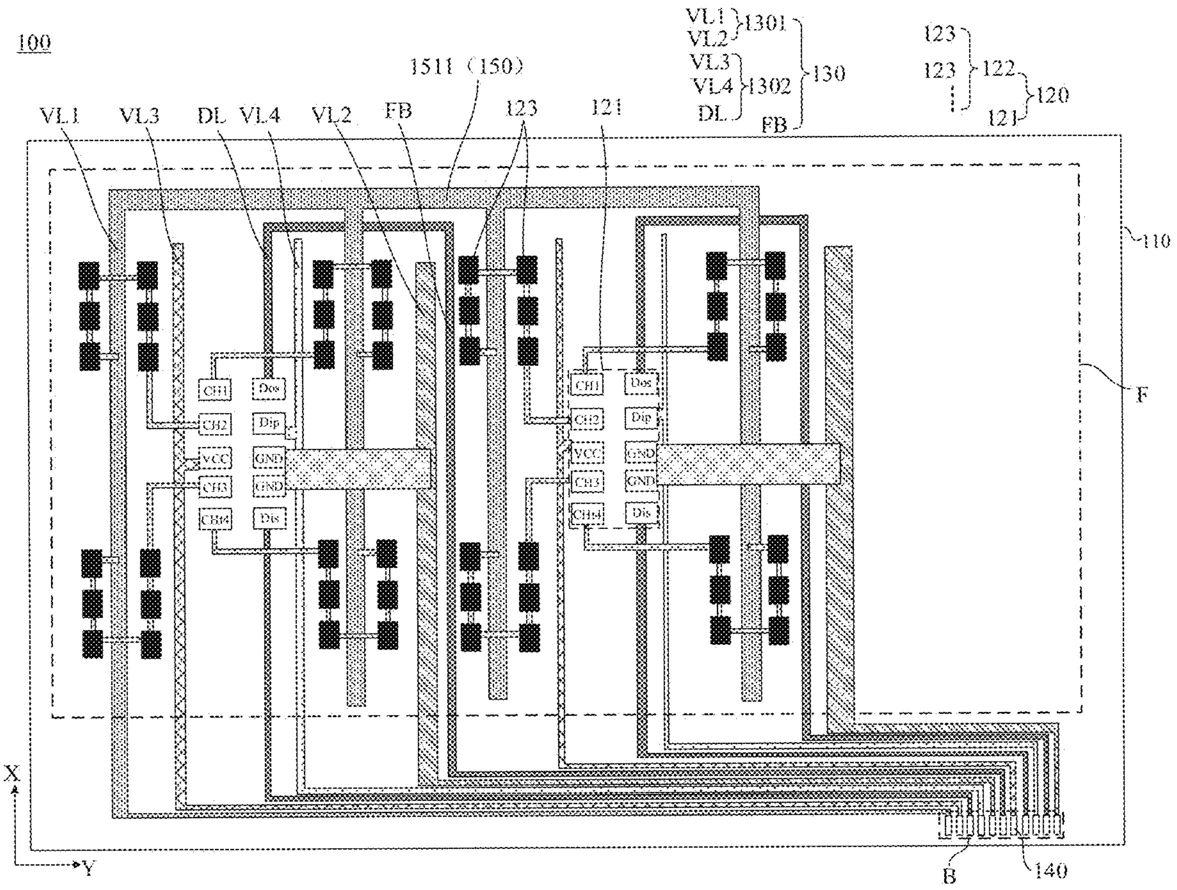
FIG. 3A is a structural diagram of a light-emitting substrate, in accordance with some embodiments of the present disclosure.
Figure 3B:
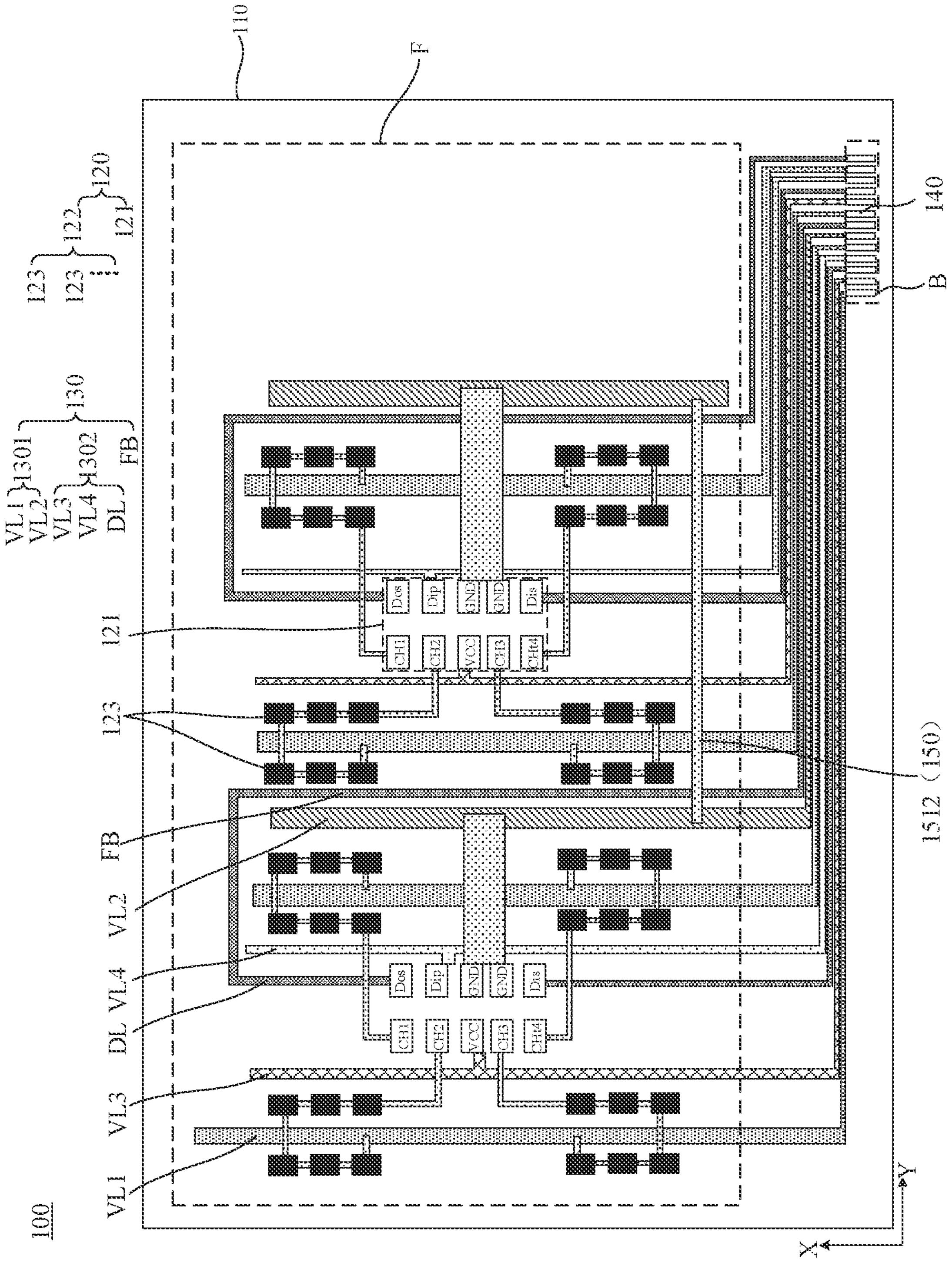
FIG. 3B is a structural diagram of another light-emitting substrate, in accordance with some embodiments of the present disclosure.
Figure 3C:
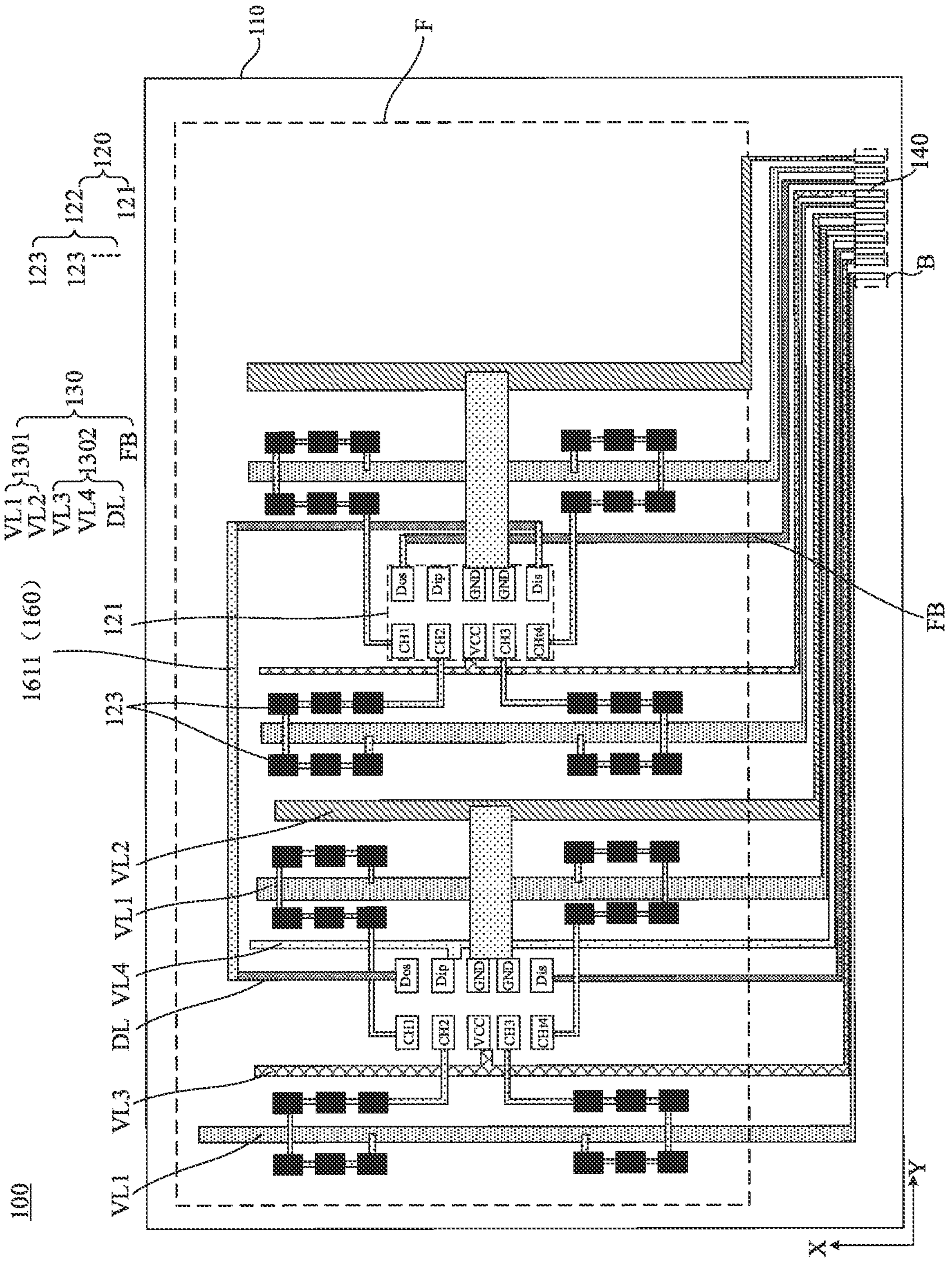
FIG. 3C is a structural diagram of yet another light-emitting substrate, in accordance with some embodiments of the present disclosure.
Figure 3D:
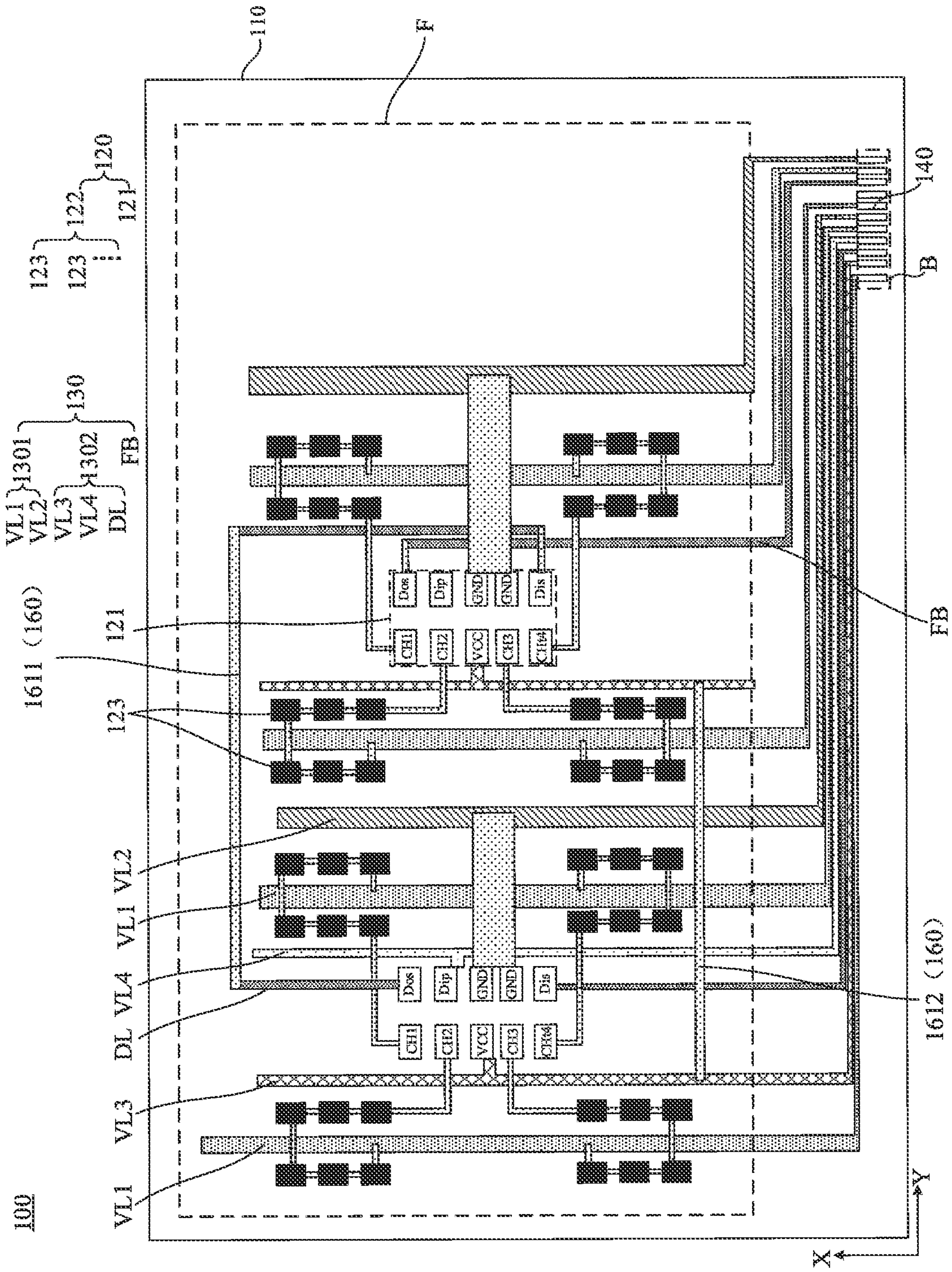
FIG. 3D is a structural diagram of yet another light-emitting substrate, in accordance with some embodiments of the present disclosure.
Figure 3E:
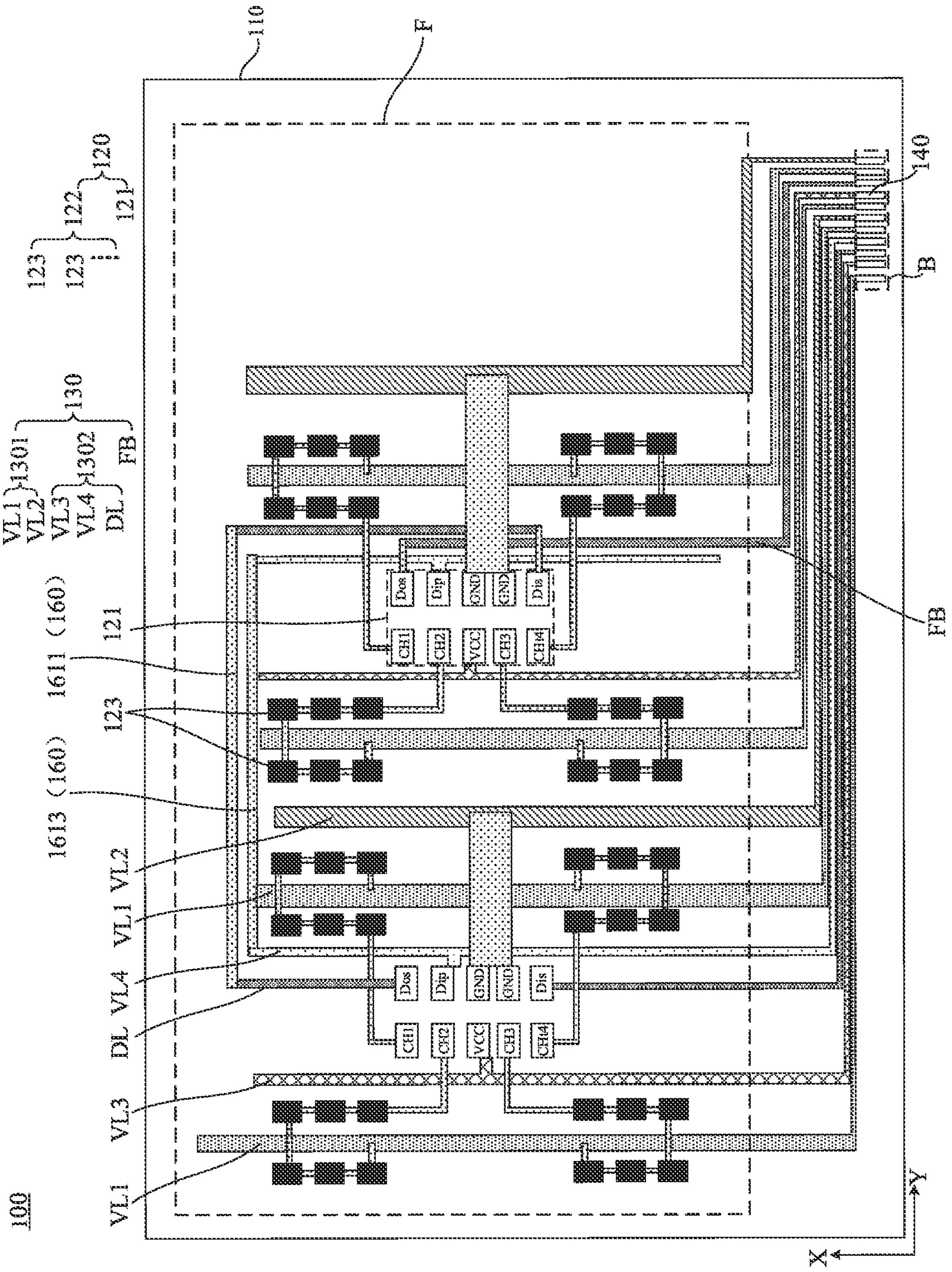
FIG. 3E is a structural diagram of yet another light-emitting substrate, in accordance with some embodiments of the present disclosure.
Figure 3F:
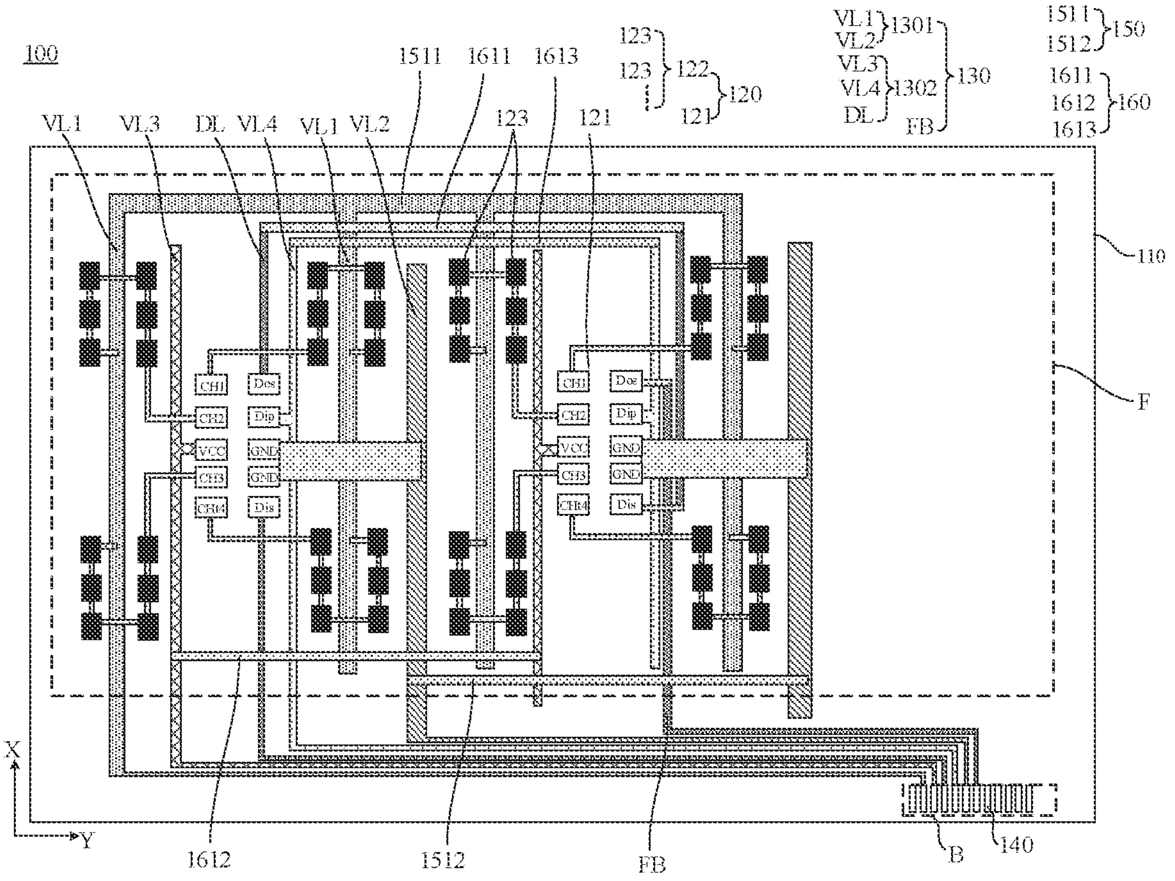
FIG. 3F is a structural diagram of yet another light-emitting substrate, in accordance with some embodiments of the present disclosure.
Figure 3G:
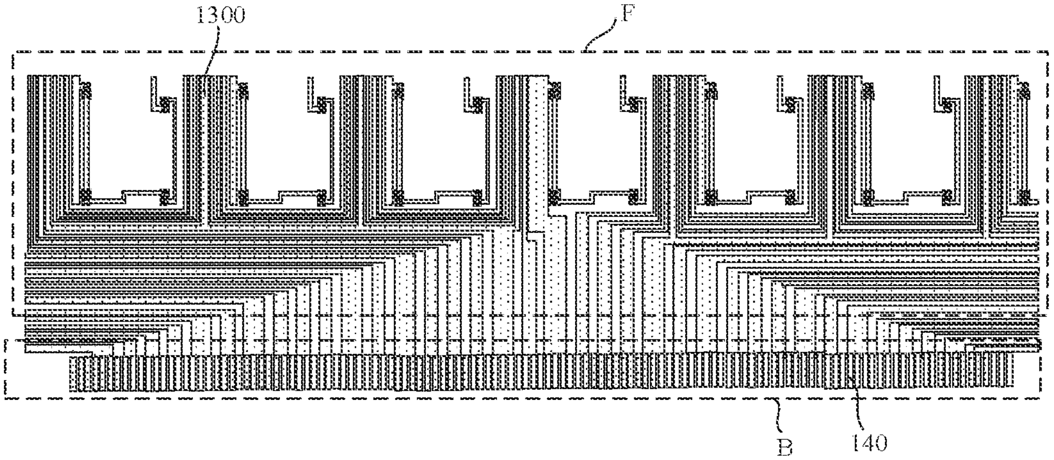
FIG. 3G is a partial structural diagram of a light-emitting substrate at a lower side, in accordance with some embodiments of the present disclosure.
Figure 4A:
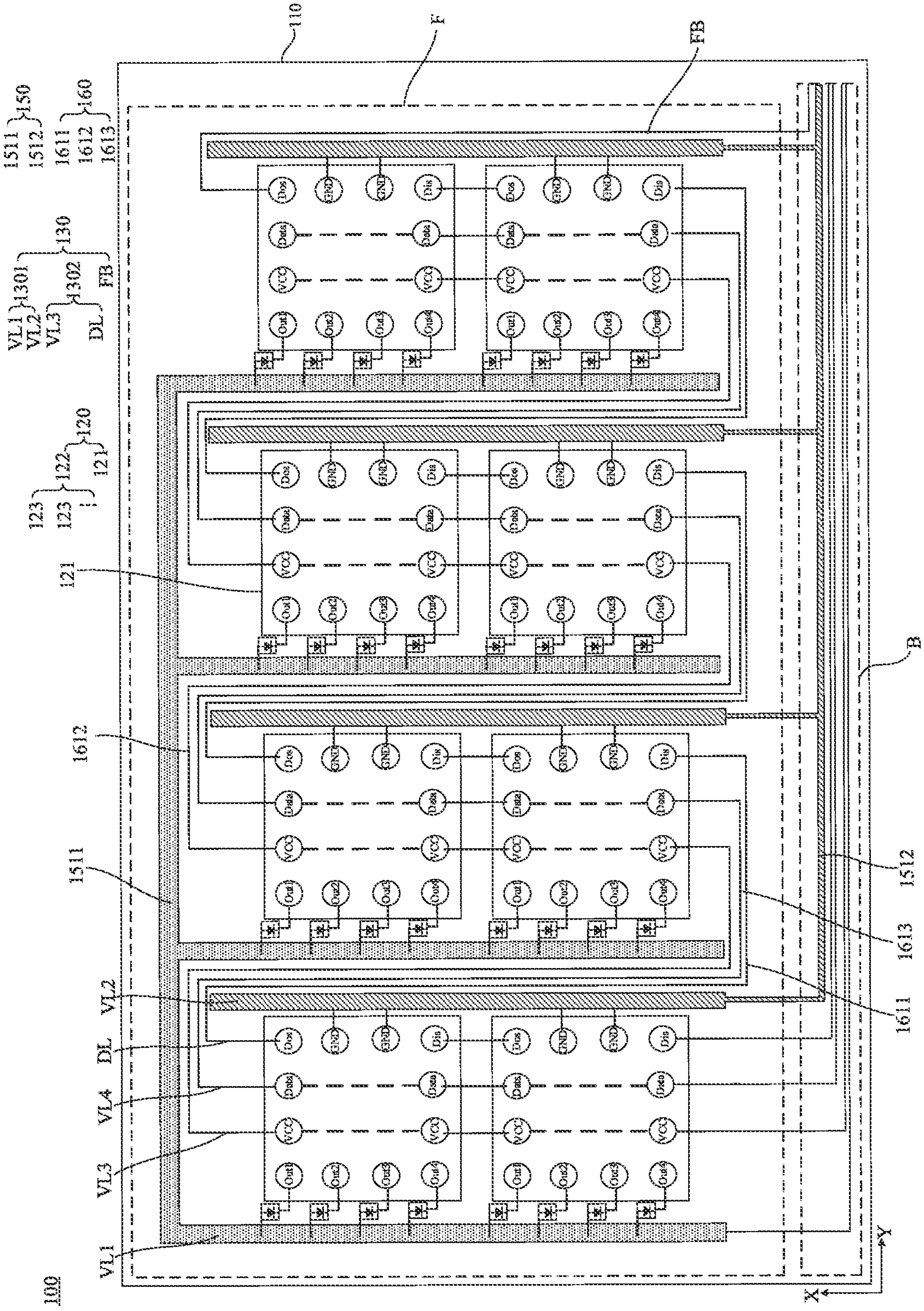
FIG. 4A is a structural diagram of yet another light-emitting substrate, in accordance with some embodiments of the present disclosure.

It will be noted that, in the accompanying drawings of the specification of the present disclosure, in order to clearly show the structure of the light-emitting substrate 100, only one row and two columns of functional element groups 120 are shown (as shown in FIGS. 3A to 3F), or two rows and four columns of functional element groups 120 are shown (as shown in FIG. 4A), and the number and arrangement of the functional element groups 120 are not further limited in the embodiments of the present disclosure.

For example, the second direction Y intersects with the first direction X.

Here, an included angle between the first direction X and the second direction Y may be set according to actual needs. For example, the included angle between the first direction X and the second direction Y is 35°, 88°, 90° or the like.

In some examples, the functional element group 120 may include a plurality of micro resistors or micro capacitors.

In some other examples, the functional element group 120 may include a driver chip 121 and at least one light-emitting device group 122. The light-emitting device group 122 may include a light-emitting device 123, or may include a plurality of light-emitting devices 123.

For example, the functional element group 120 may include a driver chip 121 and a light-emitting device group 122.

For example, the functional element group 120 may include a driver chip 121 and a plurality of light-emitting device groups 122. For example, the functional element group 120 may include a driver chip 121 and four light-emitting device groups 122. As shown in FIGS. 3A to 3F, the four light-emitting device groups 122 may respectively arranged on four extension wires at four corners of the driver chip 121, and the driver chip 121 is located in the middle of the four light-emitting device groups 122.

For example, the light-emitting device group 122 may include two light-emitting devices 123, four light-emitting devices 123, or six light-emitting devices 123.

In a case where one light-emitting device group 122 includes a plurality of light-emitting devices 123, the plurality of light-emitting devices 123 in the light-emitting device group 122 may be arranged at vertices of a hexagon, octagon or other irregular shapes; alternatively, the plurality of light-emitting devices 123 in the light-emitting device group 122 may be arranged in a shape of a circle or ellipse to meet different usage requirements, which is not limited in the embodiments of the present disclosure.

For example, in a case where one light-emitting device group 122 includes a plurality of light-emitting devices 123, a plurality of light-emitting devices 123 in a same light-emitting device group 122 may be used to emit light of a same color, or a plurality of light-emitting devices 123 in a same light-emitting device group 122 may be used to emit light of different colors.

It will be understood that, the number of light-emitting devices 123 included in different light-emitting device groups 122 may be the same or different. The number of the light-emitting devices 123 in one light-emitting device group 122 is not be limited in the embodiments of the present disclosure.

For example, the plurality of light-emitting devices 123 in a same light-emitting device group 122 are connected to each other in series. In this way, providing an electrical signal to any light-emitting device 123 in a light-emitting device group 122 may achieve the provision of the electrical signal to each light-emitting device 123 in the light-emitting device group 122, which improves the convenience of wiring of the light-emitting substrate 100.

For example, under the control of the driving signal transmitted by the driver chip 121, the light-emitting device groups 122 emit light.

For example, the light-emitting device 123 includes, but is not limited to, mini light-emitting diode (mini LED), micro light-emitting diode (micro LED) or the like.

In a case where a mini light-emitting diode or micro light-emitting diode is used as the light-emitting device 123, the light-emitting device 123 has a small grain size, which may greatly shorten the light mixing distance between adjacent light-emitting devices 123, so that the light-emitting substrate has adjustable regional brightness, high color rendering, high contrast and other advantages. Moreover, the light-emitting substrate 100 has advantages of lightness and thinness, and power saving, so that the application of the light-emitting substrate including mini LEDs or micro LEDs is flexible. In addition, compared to organic light-emitting diode (OLED), the light-emitting substrate including mini light-emitting diodes or micro light-emitting diodes have lower cost, longer service life, and less risk of screen burn.

For example, as shown in FIGS. 3A to 3F and FIG. 4A, the light-emitting substrate 100 further includes a plurality of signal line groups 130. The plurality of signal line groups 130 are located in the functional region F, and the plurality of signal line groups 130 are located on a same side of the substrate 110 as the plurality of functional element groups 120. A signal line group 130 is electrically connected to a column of functional element groups 120. The signal line group 130 includes at least one first-type signal line 1301, all first-type signal line 1301 each extend in the first direction X and are arranged at intervals in the second direction Y.

It will be understood that, the plurality of signal line groups 130 include a plurality of first-type signal lines 1301, and the lengths and/or widths of the plurality of first-type signal lines 1301 are not completely the same; the length of part of the first-type signal lines 1301 in the first direction X is substantially equal to the length of a column of functional device groups 120 in the first direction X, while the length of another part of the first-type signal lines 1301 in the first direction X is greater than the length of a column of functional device groups 120 in the first direction X.

Figure 3H:
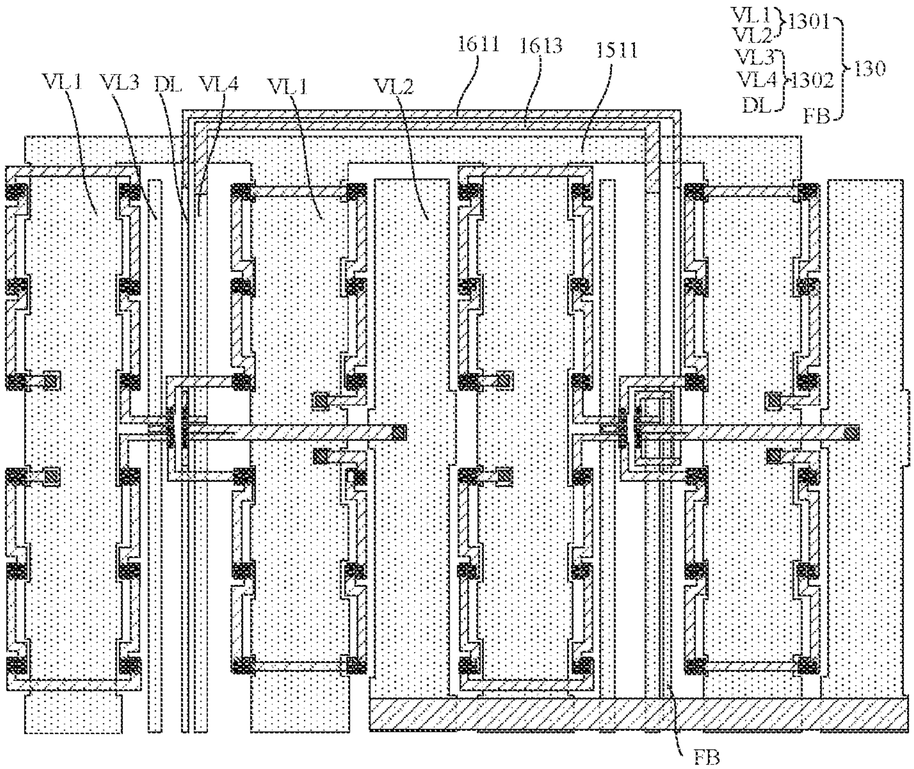
FIG. 3H is a partial structural diagram of a light-emitting substrate at an upper side, in accordance with some embodiments of the present disclosure.

In some examples, as shown in FIG. 3H, the plurality of signal line groups 130 are disposed in the same layer. That is, the plurality of signal line groups 130 are disposed in a same conductive layer. It will be understood that, in addition to the plurality of signal line groups 130, other lines may also be disposed in the conductive layer.

In some other examples, the plurality of first-type signal lines 1301 in the plurality of signal line groups 130 may be arranged in different conductive layers. For example, in the plurality of first-type signal lines 1301 in the plurality of signal line groups 130, some first-type signal lines 1301 are located in a same layer, and at least two first-type signal lines 1301 are respectively disposed in two conductive layers.

It will be understood that the plurality of signal line groups 130 are arranged on a same layer, which may reduce the number of the steps of patterning the conductive layer, thereby simplifying the manufacturing process of the light-emitting substrate 100, reducing the number of marks, and reducing the cost of the light-emitting substrate 100. Moreover, it is possible to reduce the occurrence of defective failures such as short circuit, so that the yield of the light-emitting substrate 100 is improved. In a case where the plurality of signal line groups 130 are arranged in different conductive layers, the signal line groups 130 has a high wiring flexibility.

The embodiments of the present disclosure are described by taking an example in which the plurality of signal line groups 130 are arranged in a same layer.

In some examples, the light-emitting substrate 100 further includes an insulating layer, and the insulating layer is located on a side of a conductive layer away from the substrate 110 and covers the conductive layer. That is, the insulating layer can cover the plurality of signal line groups 130 in the conductive layer and other conductive structures in the conductive layer.

It will be understood that the first-type signal line 1301 may be used to transmit a voltage signal with a constant amplitude. In a case where the signal line group 130 includes a plurality of first-type signal lines 1301, the plurality of first-type signal lines 1301 may be used to transmit different signals, or some first signal lines of the plurality of first-type signal lines 1301 may be used to transmit the same signal.

For example, the first-type signal line 1301 is made of metal or metal alloy. For example, the first-type signal line 1301 may be made of copper or aluminum, so as to improve the conductivity of the first-type signal line 1301.

In some examples, the number of first-type signal lines 1301 included in each signal line group 130 may be the same or different. The spacing, in the second direction Y, between any two adjacent first-type signal lines 1301 in a signal line group 130 may be the same or different.

For example, as shown in FIGS. 3A to 3G, FIG. 3G being a partial structural view of the lower side of the light-emitting substrate 100, and the lower side of the light-emitting substrate 100 referring to a side of the functional region F proximate to the bonding region B; the light-emitting substrate 100 further includes a plurality of bonding pins 140 located in the bonding region B.

There are a plurality of bonding pins 140, and the plurality of bonding pins 140 may be arranged at intervals in the second direction Y.

For example, a single bonding region B is provided with multiple bonding pins 140.

For example, as shown in FIG. 3A, an end of the first-type signal line 1301 is electrically connected to the bonding pins 140 in the bonding region B, and the other end extends in the first direction X, so as to extend from the bonding region B to the functional region F to be electrically connected to a column of functional element groups 120 arranged in the first direction X. It will be understood that the first-type signal line 1301 may be electrically connected to the functional element group 120 directly, or may be electrically connected to the functional element group 120 through other components or conductive patterns.

It will be understood that the light-emitting substrate 100 further includes a flexible printed circuit (FPC) and a printed circuit board (PCB). An end of the flexible circuit board is bonded to the bonding pins 140 in the bonding region B, and the other end is bonded to the printed circuit board, so that signals can be transmitted between the plurality of signal line groups 130 and the printed circuit board, thereby achieving the driving for the plurality of functional element groups 120.

It will be understood that one signal line group 130 may include first-type signal lines 1301 transmitting different signals, so as to transmit different signals to the functional element groups 120 to achieve the driving for the multiple functional element groups 120.

Figure 5:
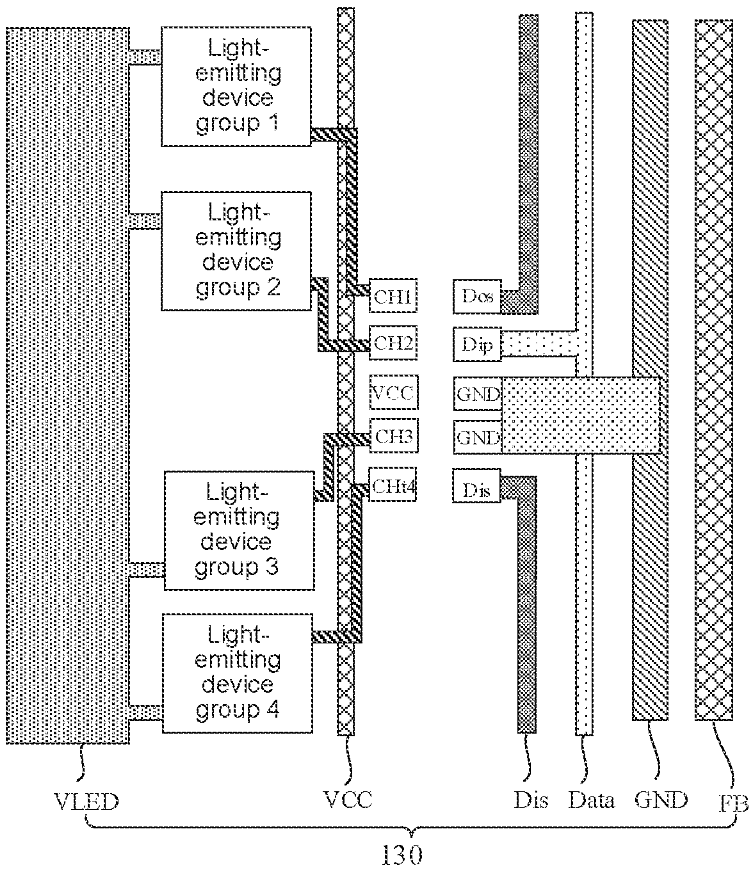
FIG. 5 is a partial structural diagram of yet another light-emitting substrate, in accordance with some embodiments of the present disclosure.
Figure 6:
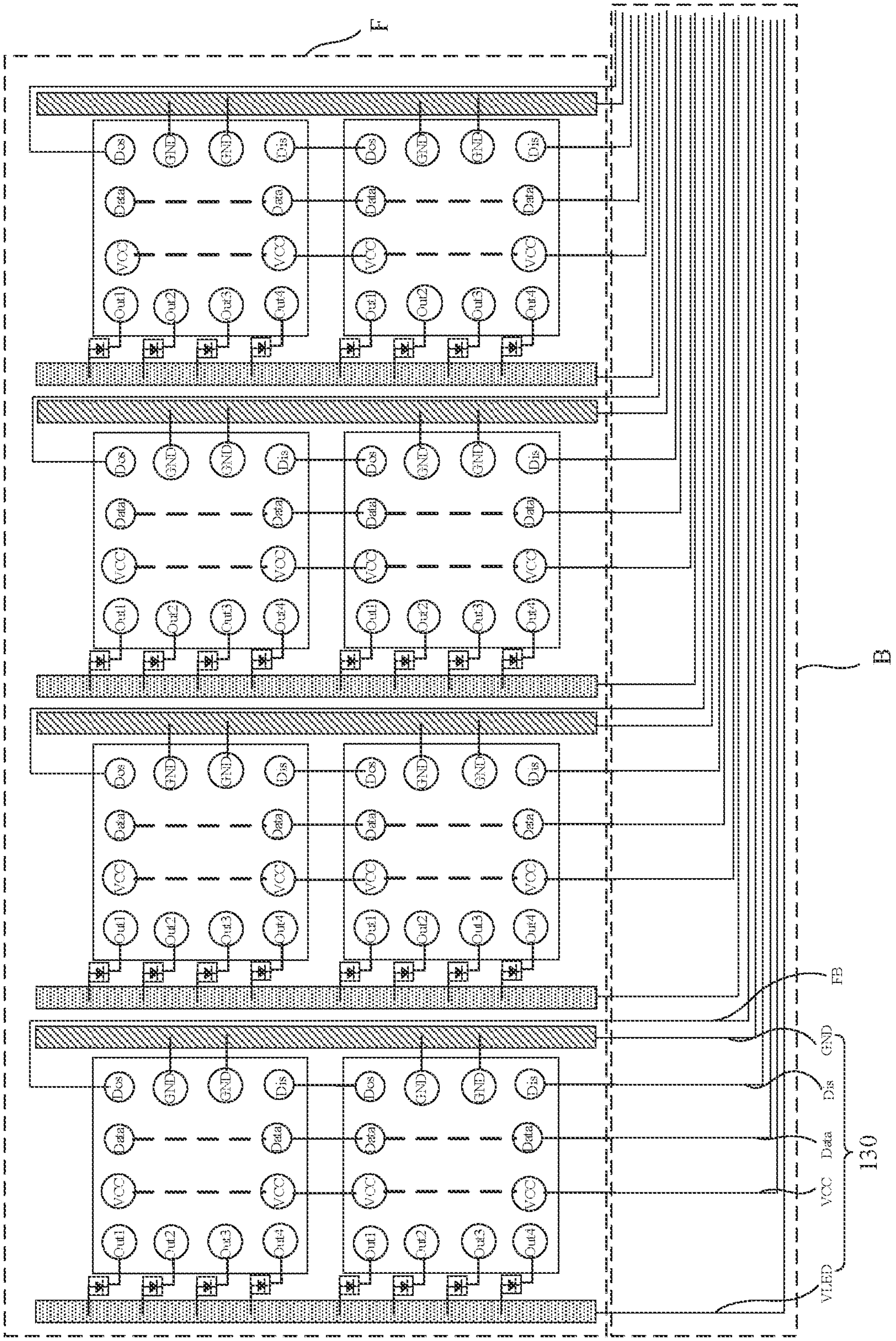
FIG. 6 is a structural diagram of yet another light-emitting substrate, in accordance with some embodiments of the present disclosure.

For example, as shown in FIGS. 5 and 6, the signal line group 130 includes a device power signal line VLED, a chip power signal line VCC, an input signal line Dis, a data signal line Data, a ground signal line GND, and an output signal line FB, and each signal line is used to transmit a different signal.

In some implementations, as shown in FIG. 6, the power signal line VLED, the chip power signal line VCC, the input signal line Dis, the data signal line Data, the ground signal line GND and the output signal line FB in each signal line group 130 are respectively electrically connected to different bonding pins 140 to transmit signals to different functional element groups 120 respectively. In a case where a plurality of signal line groups 130 are included, generally a plurality of bonding regions B are required to provide the bonding pins 140. For example, in a case where 64 signal line groups are included, 7 to 12 bonding regions B will be provided. The larger the number of bonding regions B, the larger the space occupied. In a case where the light-emitting substrate 100 is applied to the display apparatus 1, in some display apparatuses 1 (e.g., notebook), it is not possible to set more bonding regions B due to space constraints, which cause the light-emitting substrate 100 to fail to meet the requirements. On this basis, the greater the number of the bonding regions B, the greater the number of flexible circuit boards required; accordingly, the cost of the light-emitting substrate 100 may be increased. Furthermore, in the manufacturing process of the light-emitting substrate 100, the greater the number of the bonding regions B, the more difficult the process is, the higher the defective rate of the light-emitting substrate 100 will be.

Based on this, in the light-emitting substrate 100 provided in the embodiments of the present disclosure, as shown in FIGS. 3A to 3B and FIG. 4A, the light-emitting substrate 100 further includes a plurality of first-type connecting lines 150. The first-type connecting lines 150 are used to connect the first-type signal lines 1301 transmitting the same signal in at least two signal line groups 130.

For example, the first connection lines 150 each extend in the second direction Y. In this case, a dimension of the first signal line 150 in the second direction Y is at least greater than a dimension of a single light-emitting device group 122 in the second direction Y.

For example, the plurality of first-type connecting lines 150 and the signal line groups 130 may be arranged in a same conductive layer, or may be arranged in different conductive layers; for example, the plurality of first-type connecting lines 150 and the signal line groups 130 may be respectively arranged in two conductive layers, which is not limited in the embodiments of the present disclosure.

For example, the first-type connecting line 150 may be used to connect first-type signal lines 1301 that transmit the same signal in two signal line groups 130, or may be used to connect first-type signal lines 1301 that transmits the same signal in three signal line groups 130 or first-type signal lines 1301 that transmits the same signal in four signal line groups 130, which is not limited in the embodiments of the present disclosure.

For example, first-type signal lines 1301 that transmit the same signal in at least two signal line groups 130 are arranged in parallel through the first-type connecting line 150, or the first signal lines that transmit the same signal in at least two signal line groups 130 are arranged in series through the first-type connecting line 150.

For example, as shown in FIGS. 3A to 3B and FIG. 4A, among the multiple first-type signal lines 1301 electrically connected to the first-type connecting line 150, at least one first-type signal line 1301 is spaced apart from the bonding pins 140.

For example, among the multiple first-type signal lines 1301 electrically connected to the first-type connecting line 150, at least one first-type signal line 1301 is spaced from the bonding pins 140, and the two do not contact in the bonding region. The at least one first-type signal line 1301 is indirectly connected to the bonding pins 140 through the first-type connecting line 150 electrically connected thereto and other first-type signal lines 1301 connected in series or parallel thereto. Thus, the signal provided by the printed circuit board can be transmitted to a column of functional element groups 120 connected to the at least one first-type signal line 1301 through the bonding pins 140, other first-type signal lines 1301 connected in series or in parallel to the at least one first-type signal line 1301, and the first-type connecting line 150 electrically connected to the at least one first-type signal line 1301, so as to drive the column of functional element groups 120.

For example, in a case where the number of first-type signal lines 1301 electrically connected to the first-type connecting line 150 is four, only one first-type signal line 1301 may be spaced apart from the bonding pins 140, or two or three first-type signal lines 1301 are spaced apart from the bonding pins 140. For example, as shown in FIG. 3A, among the four first-type signal lines 1301 electrically connected to the first-type connecting line 150, three first-type signal lines 1301 are all spaced apart from the bonding pins 140.

For example, first-type signal lines 1301 in two signal line groups 130 connected to a same first-type connecting line 150 are used to transmit the same electrical signal and the like.

For example, among the multiple first-type signal lines 1301 electrically connected to the first-type connecting line 150, one first-type signal line 1301 is electrically connected to (for example, through a direct contact or indirect contact manner) the bonding pin 140 in the bonding region B, and the flexible circuit board is electrically connected to the first-type signal line 1301 through the bonding pin 140, so that the signal provided by the printed circuit board can be transmitted to at least two signal line groups 130 through the flexible circuit board, so as to realize the driving for the at least two functional element groups 120.

For example, the main body of the first-type signal line 1301 or the second signal line 1302 that is electrically connected to the bonding pin 140 in the bonding region B through the direct contact manner has a shape similar to the letter "L" and includes a first portion whose extension direction does not exceed an included angle of 5° with the first direction X and a second portion whose extension direction does not exceed an included angle of 5° with the second direction. A length of the first portion is equivalent to a length of a column of functional element groups 120 in the first direction X; in the second direction Y, a distance from the first portion to the bonding region B is positive correlation with the length of the second portion; and, the longer the second portion of the signal line in the second direction Y, the closer the second portion is to the bonding region B in the first direction X, and the closer the first portion is to the bonding region B in the second direction Y. It will be understood that some first-type signal lines 1301 or some second-type signal lines 1302 having a shape similar to the letter "L" further include a third portion, an end of the third portion is connected to the second portion, and the other end is connected to at least one bonding pin 140; an included angle between an extension direction of the third portion and the first direction X is no more than 5°.

For example, at least one first-type signal line 1301 or at least one second signal line 1302 spaced apart from the bonding pins 140 has a shape similar to a polygon, such as a rectangle.

For example, an orthographic projection, on the substrate 110, of the first-type signal line 1301 that is electrically connected to the bonding pin 140 in the bonding area through the direct contact manner is non-overlapping with an orthographic projection, on the substrate 110, of the light-emitting device group 122, as shown in FIGS. 3A to 3F.

In some other embodiments, an orthographic projection, on the substrate 110, of the first-type signal line 1301 that is electrically connected to the bonding pin 140 through the direct contact manner partially overlaps an orthographic projection, on the substrate 110, of a part of light-emitting device group 122 among the plurality of light-emitting device group 122 proximate to the bonding region B. In this way, it is possible to further reduce the dimension of the light-emitting substrate 100 in the first direction X, and in a case where the light-emitting substrate 100 is applied to the display apparatus 1, it may be possible to meet the requirements of narrow bezel design of the display apparatus 1.

Therefore, in the light-emitting substrate 100 provided by some embodiments of the present disclosure, the first-type connecting line 150 is connected to the first-type signal lines 1301 that transmit the same signal in at least two signal line groups 130, and among the multiple first-type signal lines 1301 electrically connected to the first-type connecting line 150, at least one first-type signal line 1301 is spaced apart from the bonding pins 140, which reduces the number of first-type signal lines 1301 that need to be electrically connected to the bonding pins 140, so that the number of bonding pins 140 that needs to be set is reduced. As a result, less bonding regions B are required to provide bonding pins 140, thereby effectively reducing the number of bonding regions B and reducing the space occupied by the bonding regions B. Furthermore, in a case where the light-emitting substrate 100 is applied to the display apparatus 1, it is possible to overcome the problem of insufficient space of the display apparatus 1 (e.g., notebook), so that the adaptability of the light-emitting substrate 100 is improved, and the application scenarios of the light-emitting substrate 100 is broadened.

In addition, the reduction in the number of bonding regions B can reduce the difficulty of the manufacturing process of the light-emitting substrate 100 to a certain extent, improve the yield of the light-emitting substrate 100, and may also shorten the time required for the manufacturing process of the bonding region B of the light-emitting substrate 100 to reduce the load on the production line and improve the production efficiency. Moreover, as the number of the bonding regions B decreases, the number of flexible circuit boards required also decreases, thereby reducing the production cost of the light-emitting substrate 100. On this basis, compared to choosing a PCB substrate as a substrate of the light-emitting substrate 100, in the light-emitting substrate 100 provided by the embodiments of the present disclosure, the reliability of the light-emitting substrate 100 is improved on the basis of realizing less bonding regions B.

In some embodiments, as shown in FIGS. 3A, 3H and 4A, FIG. 3H being a partial structural view of the upper side of the light-emitting substrate 100 (the upper side of the light-emitting substrate 100 refers to a side of the functional region F away from the bonding region B), the first-type signal lines 1301 includes at least one first voltage signal line VL1. The first voltage signal line VL1 may be electrically connected to the light-emitting device groups 122. The plurality of first-type connecting lines 150 include at least one first connecting line 1511. The first connecting line 1511 is electrically connected to the same ends of the first voltage signal lines VL1 in at least two signal line groups 130.

For example, the plurality of first-type connecting lines 150 may include one or more first connecting lines 1511.

For example, in a case where the plurality of first-type connecting lines 150 include one first connecting line 1511, the first connecting line 1511 may be used to connect any number of first voltage signal lines VL1, or the first connecting line 1511 may be used to connect all the first voltage signal lines VL1 in the plurality of signal line groups 130.

For example, in a case where the plurality of first-type connecting lines 150 include multiple first connecting lines 1511, the number of first voltage signal lines VL1 connected to a same first connecting line 1511 may be the same or different, which is not limited in the embodiments of the present disclosure.

For example, in a case where the plurality of first-type connecting lines 150 include multiple first connecting lines 1511, the plurality of first-type connecting lines 150 each extend in the second direction Y, and the plurality of first-type connecting lines 150 arranged at intervals in the second direction Y.

For example, the same first connecting line 1511 may be used to connect two first voltage signal lines VL1. Alternatively, the same first connecting line 1511 may be used to connect multiple first voltage signal lines VL1. FIGS. 3A and 4A illustrate that the same first connecting line 1511 may be used to connect four first voltage signal lines VL1.

For example, as shown in FIGS. 3A and 3H, the first-type signal line 1301 may include two first voltage signal lines VL1. Alternatively, as shown in FIG. 4A, the first-type of signal line 1301 may include one first voltage signal line VL1.

In some examples, the multiple light-emitting device groups 122 arranged in the first direction X are connected to one first voltage signal line VL1.

In some examples, multiple first voltage signal lines VL1 connected to a same first connecting line 1511 respectively belong to different signal line groups 130.

In still some examples, among multiple first voltage signal lines VL1 connected to the same first connecting line 1511, some of the first voltage signal lines VL1 belong to the same signal line group 130. For example, among the multiple first voltage signal lines VL1 connected to the same first connecting line 1511, two first voltage signal lines VL1 belong to the same signal line group 130, as shown in FIGS. 3A and 3H.

For example, the first voltage signal line VL1 is located in the functional region F, and one first voltage signal line VL1 is electrically connected to a column of light-emitting device groups 122. Among multiple first voltage signal lines VL1 electrically connected to the first connecting line 1511, at least one first voltage signal line VL1 is spaced apart from the bonding pins 140, and part of the first voltage signal lines VL1 extends from the functional region F to the bonding region B to be electrically connected to the bonding pin 140 located in the bonding region B through the direct contact manner, so that the signal from the printed circuit board may be transmitted to the light-emitting device group 122.

For example, the first voltage signal line VL1 is used to provide a large constant current voltage for the light-emitting devices 123 in the light-emitting device group 122. In a case where the light-emitting device group 122 includes a plurality of light-emitting devices 123, and the plurality of light-emitting devices 123 are connected to each other in series, among the plurality of light-emitting devices 123 connected in series, the first light-emitting device 123 is electrically connected to the first voltage signal line VL1, and among the plurality of light-emitting devices 123 connected in series, the last light-emitting chip device 123 is electrically connected to the driver chip 121.

For example, among the multiple first voltage signal lines VL1 electrically connected to a same first connecting line 1511, one first voltage signal line VL1 extends from the functional region F to the bonding region B, and is electrically connected to the bonding pin 140 located in the bonding region B.

For example, the power supply outside the light-emitting substrate 100 is electrically connected to the first voltage signal line VL1 through the printed circuit board and the bonding pins 140, so that the power supply can supply power to light-emitting devices 123 in a column of light-emitting device groups 122 through the first voltage signal line VL1 to make the light-emitting devices 123 emit light.

In some examples, the material of the first connecting line 1511 is the same as that of the first voltage signal line VL1, and the first connecting line 1511 and the first voltage signal line VL1 are arranged in a same layer, i.e., arranged in a same conductive layer, as shown in FIGS. 3A to 3F and FIG. 4A.

For example, the material of the first connecting line 1511 and the material of the first voltage signal line VL1 may both be metal; for example, the metal may be copper.

The "same layer" refers to a layer structure that is formed by forming a film layer for forming specific patterns by using a same film forming process, and then performing a single patterning process by using a same mask. Depending on different specific patterns, the single patterning process may include multiple exposure, development or etching processes, and the specific patterns in the formed layer structure may be continuous or discontinuous, and these specific patterns may also be at different heights or have different thicknesses.

In still some examples, the first connecting line 1511 and the first voltage signal line VL1 may be disposed in different conductive layers: for example, the first connecting line 1511 and the first voltage signal line VL1 may be disposed in two conductive layers respectively. In this case, the material of the first connecting line 1511 and the material of the first voltage signal line VL1 may be the same or different, which is not limited in the embodiments of the present disclosure.

It will be understood that the "same ends of the first voltage signal lines VL1 in the at least two signal line groups 130" mentioned above may be ends of the first voltage signal lines VL1 in the at least two signal line groups 130 proximate to the bonding region B, or ends of the first voltage signal lines VL1 in the at least two signal line groups 130 away from the bonding region B, which is not limited in the embodiment of the present disclosure.

In these embodiments, multiple first voltage signal lines VL1 electrically connected to multiple columns of light-emitting device groups 122 are electrically connected through the first connecting line 1511; among the multiple first voltage signal lines VL1 connected to the first connecting line 1511, at least one first voltage signal line VL1 is spaced apart from the bonding pins 140, and some first voltage signal lines VL1 are electrically connected to the bonding pins 140 located in the bonding region B through the direct contact manner, and the signal provided by the printed circuit board is transmitted to the multiple columns of light-emitting device groups 122 through the some first voltage signal lines VL1 and the bonding pins 140. In this way, the number of the first voltage signal lines VL1 that need to be electrically connected directly to the bonding pins 140 in the bonding region B is reduced, so that the number of bonding pins 140 that needs to be set is reduced. As a result, less bonding regions B are required to provide bonding pins 140, thereby effectively reducing the number of bonding regions B and reducing the space occupied by the bonding regions B. Furthermore, in a case where the light-emitting substrate 100 is applied to the display apparatus 1, it is possible to overcome the problem of insufficient space of the display apparatus 1 (e.g., notebook), so that the application scenarios of the light-emitting substrate 100 is broadened.

In some embodiments, as shown in FIGS. 3A and 4A, the first connecting line 1511 extends in the second direction Y, and is located on a side (i.e., the upper side of the light-emitting substrate) of the functional region F away from the bonding region B.

For example, multiple first voltage signal lines VL1 connected to a same first connecting line 1511 are arranged in parallel. Thus, it may be possible to reduce the voltage drop between the light-emitting device groups 122 connected to the multiple first voltage signal lines VL1, so that the luminous efficiency of the light-emitting device groups 122 may be improved.

In these embodiments, the first connecting line 1511 extends in the second direction Y, and is electrically connected to the same ends of the first voltage signal lines VL1 in at least two signal line groups 130, which can reduce the number of the first voltage signal lines VL1 that need to be electrically connected directly to the bonding pins 140 in the bonding region B is reduced, so that the number of the bonding regions is reduced. On this basis, the first connecting line 1511 is located on a side of the functional region F away from the bonding region B, and there is no other structure provided between the first connecting line 1511 and an end of the first voltage signal lines VL1 away from the bonding region B, so that the electrical connection between the first connecting line 1511 and the first voltage signal line VL1 does not need to cross other film layers, and is achieved in a same layer. In this way, it is possible to simplify the manufacturing process of the light-emitting substrate 100, reduce the number of the masks, and reduce the cost of the light-emitting substrate 100. Moreover, it is also possible to reduce the occurrence of defective failures such as short circuit, so that the yield of the light-emitting substrate 100 is improved.

For example, the first connecting line 1511 is electrically connected to the first voltage signal lines VL1 to be of a one-piece structure.

The above "one-piece structure" means that two connected patterns are arranged in a same layer, and the two patterns are continuous and not separated. The arrangement described above may make the first connecting line 1511 and the first voltage signal line VL1 electrically connected thereto be formed in a single patterning process, thereby simplifying the manufacturing process of the light-emitting substrate 100. In addition, the arrangement of "one-piece structure" can improve the reliability of the electrical connection between the first connecting line 1511 and the first voltage signal line VL1, and there is no need to provide other conductive structures, so that the manufacturing cost of the light-emitting substrate 100 is reduced.

In some embodiments, as shown in FIGS. 3A to 3F and FIG. 4A, multiple light-emitting device groups 122 in a same column of functional element groups 120 are arranged in at least one column, and a column of light-emitting device groups 122 is electrically connected to a first voltage signal line VL1.

In some examples, the multiple light-emitting device groups 122 in a same column of functional element groups 120 are arranged in multiple columns. For example, the multiple light-emitting device groups 122 in a same column of functional element groups 120 are arranged in two columns, as shown in FIGS. 3A to 3F.

For example, in a case where the multiple light-emitting device groups 122 in the same column of functional element groups 120 are arranged in two columns, the first voltage signal lines VL1 connected to multiple light-emitting device groups 122 in the two columns are respectively located between multiple light-emitting device groups 122 in the respective column of the two columns.

In some other examples, multiple light-emitting device groups 122 in a same column of functional element groups 120 are arranged in a column, as shown in FIG. 4A.

In these embodiments, one first voltage signal line VL1 is used to provide a voltage signal of working power for a column of light-emitting device groups 122, so that the light-emitting devices 123 in the column of light-emitting device groups 122 can emit light. In this way, the wiring arrangement of the light-emitting substrate 100 is simplified, so as to simplify the structure of the light-emitting substrate 100, and reduce the difficulty of manufacturing the light-emitting substrate 100.

In some embodiments, as shown in FIGS. 3A and 3F, an orthogonal projection, on the substrate 110, of the column of light-emitting device groups 122 electrically connected to the first voltage signal line VL1 at least partially overlaps with an orthogonal projection, on the substrate 110, of the first voltage signal line VL1.

In some examples, as shown in FIGS. 3A and 3F, the orthogonal projection, on the substrate 110, of the column of light-emitting device groups 122 electrically connected to the first voltage signal line VL1 partially overlaps with the orthogonal projection, on the substrate 110, of the first voltage signal line VL1.

For example, multiple light-emitting devices 123 in one light-emitting device group 122 are connected by a wire, and an orthographic projection, on the substrate 110, of the wire connecting all the multiple light-emitting devices 123 partially overlaps with the orthogonal projection, on the substrate 110, of the first voltage signal line VL1.

Those skilled in the art will be understand that, in a case where the light-emitting substrate 100 includes two conductive layers, the signal line group 130 is generally located in one conductive layer proximate to the substrate 110, and the wire connecting all the light-emitting device 123 are generally located in another conductive layer away from the substrate 110. Moreover, the materials of the two conductive layers generally both include copper, in a case where a negative voltage difference is generated between the connecting wire connecting all the light-emitting devices 123 and the signal lines located below all the light-emitting devices 123, copper ions are more likely to migrate and grow, resulting in defective failures such as short circuit between the two conductive layers, so that the product stability of the light-emitting substrate 100 is reduced.

The "negative voltage difference" means that the voltage of the wire connecting all the light-emitting devices 123 is greater than the voltage of the signal line below all the light-emitting devices 123, thereby generating a negative voltage difference. For example, an orthographic projection of a column of light-emitting device groups 122 on the substrate 110 partially overlaps with an orthographic projection of a ground signal line on the substrate 110. The ground signal line is generally at zero potential. In this case, the voltage of the wire connecting all the light-emitting devices 123 is greater than the voltage of the ground signal line, so that a negative voltage difference is generated.

Conversely, "positive voltage difference" means that the voltage of the wire connecting all the light-emitting devices 123 is less than the voltage of the signal line below all the light-emitting devices 123, thereby generating a positive voltage difference. Specifically, in the embodiments of the present disclosure, the voltage of the wire connected to all the light-emitting devices 123 is less than the voltage of the first voltage signal line VL1 located below all the light-emitting devices 123, so that a positive voltage difference is generated.

In these embodiments, an orthographic projection of a column of light-emitting device groups 122 connected to the first voltage signal line VL1 on the substrate 110 partially overlaps the orthographic projection of the first voltage signal line VL1 on the substrate 110, and the voltage of the first voltage signal line VL1 is greater than the voltage of the wire connecting all the light-emitting device 123, so that a positive voltage difference is generated. Thus, it is possible to inhibit the migration and growth of copper ions in the two conductive layers, which may further effectively reduce the probability of short circuit between the two conductive layers, so that the yield, safety and stability of the light-emitting substrate 100 are all improved, and the service life of the light-emitting substrate 100 is prolonged.

Figure 4B:
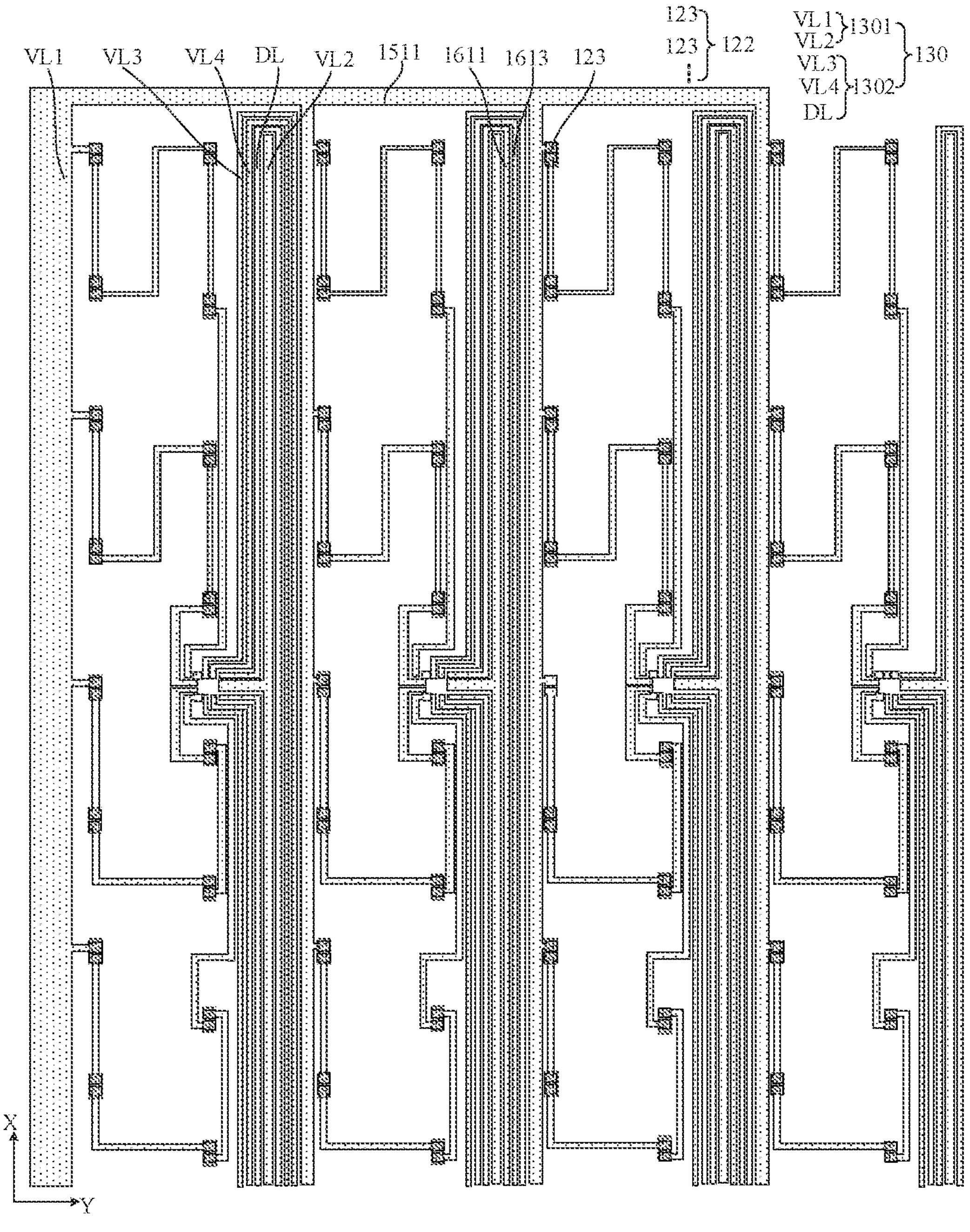
FIG. 4B is a partial structural diagram of another light-emitting substrate at an upper side, in accordance with some embodiments of the present disclosure.
Figure 4C:
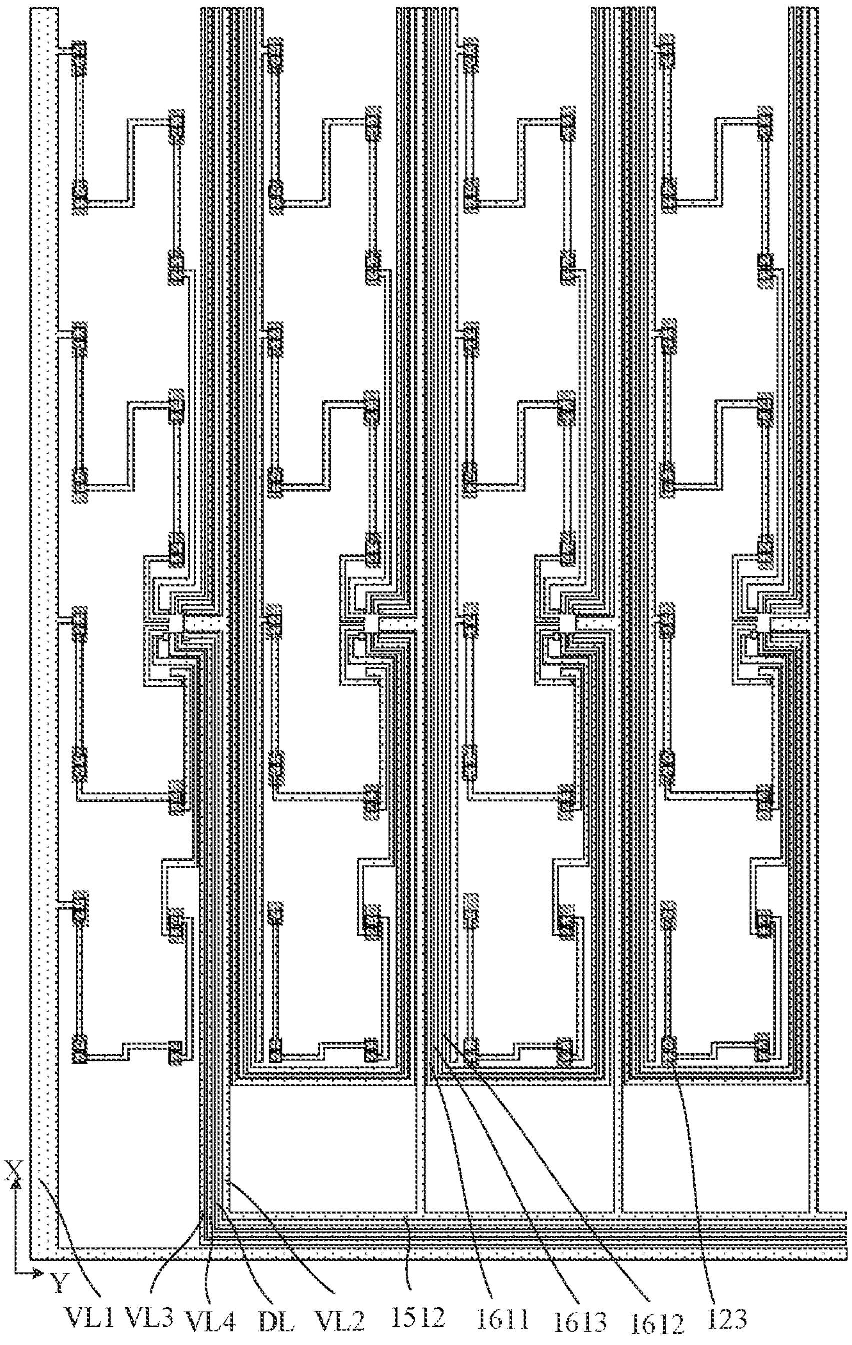
FIG. 4C is a partial structural diagram of another display substrate at a lower side, in accordance with some embodiments of the present disclosure.

In some embodiments, as shown in FIGS. 4B and 4C, FIG. 4B being a partial structural view of the upper side of the light-emitting substrate 100 provided by some embodiments of the present disclosure, and FIG. 4C being a partial structural view of the lower side of the light-emitting substrate 100 provided by some embodiments of the present disclosure, the light-emitting devices 123 included in the plurality of light-emitting device groups 122 are arranged in a plurality of rows in the first direction X, and arranged in a plurality of columns in the second direction Y; any two adjacent rows of light-emitting devices 123 are arranged in a staggered manner.

For example, the distance between any two adjacent rows of light-emitting devices 123 may be equal or unequal, which is not limited in the embodiments of the present disclosure.

In these embodiments, by arranging any two adjacent rows of light-emitting devices 123 staggered, a light mixing vacancy area between any two adjacent columns of light-emitting devices 123 may be reduced, so that the light-emitting substrate 100 has a good light mixing effect.

In some embodiments, as shown in FIGS. 3A to 3F, multiple driver chips 121 in a same column of functional element groups 120 are arranged in a column in the first direction X. The multiple light-emitting device groups 122 in a same column of functional element groups 120 are located on two opposite sides, in the second direction Y, of the multiple driver chips 121 in the same column of functional element groups 120.

For example, as shown in FIGS. 3A to 3F, the multiple light-emitting device groups 122 in the same column of functional element groups 120 are arranged in two columns in the second direction Y, and the two columns of light-emitting device groups 122 are located in two opposite sides, in the second direction Y, of the multiple driver chips 121 in the same column of functional element groups 120.

With the above arrangement, the two columns of light-emitting device groups 122 emit light under the control of the driving signal transmitted by the same column driver chips 121; in a case where the number of the columns of the light-emitting device groups 122 is the same, the number of the signal line groups 130 that is required is less, and the number of the first voltage signal lines VL1 that are need to extend from the functional region F to the bonding region B and electrically connected to the bonding pins 140 in the bonding region B is reduced, and moreover, the number of the required bonding pins 140 is reduced. In this way, less bonding regions B are required to provide bonding pins 140, thereby effectively reducing the number of bonding regions B and reducing the space occupied by the bonding regions B. Furthermore, in a case where the light-emitting substrate 100 is applied to the display apparatus 1, it is possible to overcome the problem of insufficient space of the display apparatus 1 (e.g., notebook), so that the adaptability of the light-emitting substrate 100 is improved, and the application scenarios of the light-emitting substrate 100 is broadened.

In some embodiments, as shown in FIGS. 3A to 3F and FIG. 4A, the first-type signal line 1301 includes a ground signal line VL2, and the ground signal line VL2 is electrically connected to the driver chip 121.

For example, as shown in FIG. 3B, the plurality of first-type connecting sub-lines 150 include at least one second connecting line 1512. The second connecting line 1512 is electrically connected to the same ends of ground signal lines VL2 in at least two signal line groups 130.

For example, a voltage signal transmitted by the ground signal line VL2 is a constant voltage signal.

For example, the ground signal line VL2 is used to ground the driver chip 121.

For example, in a case where multiple light-emitting device groups 122 in a same column of functional element groups 120 are arranged in two columns in the second direction Y, i.e., each column of driver chips 121 controls two columns of light-emitting device groups 122, the ground signal line VL2 is located between two columns of light-emitting device groups 122 that are controlled by different columns of driver chips 121.

For example, the plurality of first-type connecting lines 150 may include one or more second connecting lines 1512.

For example, in a case where the plurality of first-type connecting lines 150 include one second connecting line 1512, the second connecting line 1512 may be used to connect any number of ground signal lines VL2, or the second connecting line 1512 may be used to connect all the ground signal lines VL2 in the plurality of signal line group 130.

For example, in a case where the plurality of first-type connecting lines 150 include multiple second connecting lines 1512, the number of ground signal lines VL2 connected to a same second connecting line 1512 may be the same or different, which is not limited in the embodiments of the present disclosure.

For example, the same second connecting line 1512 may be used to connect two ground signal lines VL2, as shown in FIG. 3B. Alternatively, the same second connecting line 1512 may be used to connect multiple ground signal lines VL2, FIG. 4A shows that the same second connecting line 1512 may be used to connect four ground signal lines VL2.

For example, the ground signal lines VL2 are located in the functional region F, one ground signal line VL2 is electrically connected to a column of driver chips 121; and among the multiple ground signal lines VL2 electrically connected to the same second connecting line 1512, at least one ground signal line VL2 is spaced apart from the bonding pins 140, and some ground signal lines VL2 each extend from the functional region F to the bonding region B and is electrically connected to the bonding pin 140 located in the bonding region B.

For example, among the multiple ground signal lines VL2 connected to the same second connecting line 1512, an end of one ground signal line VL2 is electrically connected to the bonding pin 140 in the bonding region B, and the other end of the ground signal line VL2 extends to the functional region F and is electrically connected to a column of driver chips 121. It can be known from the above that the driver chip 121 is electrically connected to the light-emitting device groups 122, so that the ground signal line VL2 may be electrically connected to the light-emitting device groups 122 through the driver chip 121.

In some examples, as shown in FIG. 3B and FIG. 4A, the driver chip 121 has at least one ground pin GND. An end of the ground signal line VL2 is electrically connected to the printed circuit board through the bonding pin 140, and the other end of the ground signal line VL2 is electrically connected to the ground pin GND of the driver chip 121 to ground the driver chip 121.

In some examples, the second connecting line 1512 and the ground signal line VL2 may be disposed in the same conductive layer.

In still some examples, the second connecting line 1512 and the ground signal line VL2 may be disposed in different conductive layers. For example, the second connecting line 1512 and the ground signal line VL2 may be respectively disposed in two conductive layers. In this case, the material of the second connecting line 1512 and the material of the ground signal line VL2 may be the same or different, which is not limited in the embodiments of the present disclosure.

In these embodiments, multiple ground signal lines VL2 electrically connected to multiple columns of driver chips 121 are electrically connected to each other through the second connecting line 1512; among the multiple ground signal lines VL2 connected to the second connecting line 1512, at least one ground signal line VL2 is spaced apart from the bonding pins 140, and some ground signal lines VL2 are electrically connected to the bonding pins 140 located in the bonding region B through the direct contact manner, so that the multiple columns of driver chips 121 may be grounded. In this way, the number of the ground signal lines VL2 that need to be electrically connected directly to the bonding pins 140 in the bonding region B is reduced, so that the number of bonding pins 140 that needs to be set is reduced. As a result, less bonding regions B are required to provide bonding pins 140, thereby effectively reducing the number of bonding regions B and reducing the space occupied by the bonding regions B. Furthermore, in a case where the light-emitting substrate 100 is applied to the display apparatus 1, it is possible to overcome the problem of insufficient space of the display apparatus 1 (e.g., notebook), so that the adaptability of the light-emitting substrate 100 is improved, and the application scenarios of the light-emitting substrate 100 is broadened.

In some embodiments, as shown in FIGS. 3B and 4A, the second connecting line 1512 extends in the second direction Y, and is located on a side of the functional region F proximate to the bonding region B.

For example, the multiple ground signal lines VL2 connected to the same second connecting line 1512 are arranged in parallel.

In these embodiments, the second connecting line 1512 extends in the second direction Y and is electrically connected to the same ends of the ground signal lines VL2 in the at least two signal line groups 130; among the multiple ground signal lines VL2 connected to the second connecting line 1512, at least one ground signal line VL2 is spaced apart from the bonding pins 140, and only some ground signal lines VL2 are electrically connected to the bonding pins 140 located in the bonding region B through the direct contact manner, so that the number of the ground signal lines VL2 that need to be electrically connected directly to the bonding pins 140 in the bonding region B is reduced, and thus the number of the bonding regions B is reduced.

In some embodiments, as shown in FIGS. 3A to 3F and FIG. 4A, the number of functional element groups 120 in each column is N, and N driver chips in each column of functional element groups 120 are cascaded in sequence.

For example, as shown in FIGS. 3A to 3F and FIG. 4A, the signal line group 130 further includes at least one second-type signal line 1302, and the second-type signal lines 1302 each extend in the first direction X and are arranged at interval in the second direction Y.

For example, as shown in FIGS. 3C to 3F and FIG. 4A, the light-emitting substrate 100 further includes a plurality of second-type connecting lines 160. The second-type connecting line 160 is used to connect second-type signal lines 1302 transmitting the same signal in at least two signal line groups 130.

For example, the plurality of second-type connecting lines 160 and the signal line groups 130 may be arranged in a same conductive layer, or may be arranged in different conductive layers; for example, the plurality of second-type connecting lines 160 and the signal line groups 130 may be respectively arranged in two conductive layers, which is not limited in the embodiments of the present disclosure.

For example, the second-type connecting line 160 may be used to connect second-type signal lines 1302 that transmit the same signal in two signal line groups 130, or may be used to connect second-type signal lines 1302 that transmits the same signal in three signal line groups 130 or second-type signal lines 1302 that transmits the same signal in four signal line groups 130, which is not limited in the embodiments of the present disclosure.

For example, second-type signal lines 1302 that transmit the same signal in at least two signal line groups 130 are arranged in parallel through the second-type connecting line 160, or the second-type signal lines 1302 that transmit the same signal in at least two signal line groups 130 are arranged in series through the second-type connecting line 160.

For example, as shown in FIGS. 3C to 3F and FIG. 4A, among the multiple second-type signal lines 1302 electrically connected to the second-type connecting line 160, at least one second-type signal line 1302 is spaced apart from the bonding pins 140.

For example, among the multiple second-type signal lines 1302 electrically connected to the second-type connecting line 160, at least one second-type signal line 1302 is spaced from the bonding pins 140, and the two do not contact in the bonding region; the at least one second-type signal line 1302 is indirectly connected to the bonding pin 140 through the second-type connecting line 160 electrically connected thereto and other second-type signal lines 1302 connected in series or parallel thereto. Thus, the signal provided by the printed circuit board can be transmitted to a column of functional element groups 120 connected to the at least one second-type signal line 1302 through the bonding pin 140, other second-type signal lines 1302 connected in series or in parallel to the at least one second-type signal line 1302, and the second-type connecting line 160 electrically connected to the at least one second-type signal line 1302, so as to drive the column of functional element groups 120.

For example, in a case where the number of second-type signal lines 1302 electrically connected to the second-type connecting line 160 is four, only one second-type signal line 1302 may be spaced apart from the bonding pins 140, or two or three second-type signal lines 1302 are spaced apart from the bonding pins 140.

For example, among the multiple second-type signal lines 1302 electrically connected to the second-type connecting line 160, one second-type signal line 1302 is electrically connected to the bonding pin 140, and the flexible circuit board is electrically connected to the second-type signal lines 1302 through the bonding pins 140, so that the signal provided by the printed circuit board can be transmitted to at least two signal line groups 130 through the flexible circuit board, so as to realize the driving for the at least two functional element groups 120.

Therefore, in the light-emitting substrate 100 provided by some embodiments of the present disclosure, the second-type connecting line 160 is connected to the second-type signal lines 1302 that transmit the same signal in at least two signal line groups 130; among the multiple second-type signal lines 1302 electrically connected to the second-type connecting line 160, at least one second-type signal line 1302 is spaced apart from the bonding pins 140, which reduces the number of second-type signal lines 1302 that need to be electrically connected to the bonding pins 140, so that the number of bonding pins 140 that needs to be set is reduced. As a result, less bonding regions B are required to set bonding pins 140, thereby effectively reducing the number of bonding regions B and reducing the space occupied by the bonding region B. Furthermore, in a case where the light-emitting substrate 100 is applied to the display apparatus 1, it is possible to overcome the problem of insufficient space of the display apparatus 1 (e.g., notebook), so that the adaptability of the light-emitting substrate 100 is improved, and the application scenarios of the light-emitting substrate 100 is broaden.

In some embodiments, as shown in FIG. 4A, the second-type signal lines 1302 include multiple address signal lines DL, and any two adjacent driver chips 121 of N drive chips in each column are electrically connected to each other through the address signal line DL. The plurality of second-type connecting lines 160 include at least one third connecting line 1611. Among M columns of driver chips in which N driver chips are in each column, any two adjacent columns of driver chips are electrically connected to each other through the third connecting line 1611, where M 2, and M is a positive integer.

For example, as shown in FIG. 4A, the driver chip 121 has an input terminal Dis and an output terminal Dos. An end of the address signal line DL is electrically connected to the input terminal Dis of one of two adjacent driver chips 121, and the other end of the address signal line DL is electrically connected to the output terminal Dos of the other of the two adjacent driver chips 121.

Specifically, as shown in FIG. 4A, the specific cascaded structure of the above N driver chips may be that, in a direction of the functional region F away from the bonding region B, the input terminal Dis of the first-stage driver chip 121 is electrically connected to the bonding pin 140 in the bonding region B; except the first-stage driver chip 121, the input terminal Dis of any-stage driver chip 121 is electrically connected to the output terminal Dos of the previous-stage driver chip 121 of the current-stage driver chip 121 through an address signal line DL; the output terminal Dos of the last-stage driver chip 121 is electrically connected to another address signal line DL. In this way, the signal output by the printed circuit board may be transmitted to the multiple driver chips 121 through the address signal lines DL.

For example, the plurality of second-type connecting lines 160 may include one or more third connecting lines 1611.

For example, one third connecting line 1611 is used to connect two columns of driver chips in which N driver chips are in each column. For example, as shown in FIG. 3C, one row and two columns of driver chips are schematically shown in FIG. 3C. The two columns of driver chips are electrically connected to each other through one third connecting line 1611.

For example, in a case where the plurality of second-type connecting lines 160 may include one third connection line 1611, two columns of N driver chips are electrically connected to each other through one third connection line 1611.

For example, in a case where the plurality of second-type connecting lines 160 may include multiple third connecting lines 1611, the number of third connecting lines 1611 electrically connected to the M columns of N driver chips may be M−1, and any two adjacent columns of N driver chips are connected to each other through the third connecting line 1611; M columns of N driver chips are connected in series through M−1 third connecting lines 1611. For example, as shown in FIG. 4A, two rows and four columns of driver chips are schematically shown in FIG. 4A, Any two adjacent columns of driver chips in which N driver chips are in each column in the four columns of driver chips are electrically connected to each other through the third connecting line 1611. The four columns of driver chips are connected in series through three third connecting lines 1611.

For example, the signal line group 130 further includes a output signal line FB, among the M columns of N driver chips connected in series through M−1 third connecting lines 1611, the address signal line DL connected to the first-stage driver chip 121 in the first column of N driver chips extends from the functional region F to the bonding region B and is electrically connected to the bonding pins 140 in the bonding region B; an end of the M-th column of N driver chips is electrically connected to the third connecting lines 1611, and the other end of the M-th column of N driver chips is electrically connected to the output signal line FB, and the output signal line FB extends from the functional region F to the bonding region B and is electrically connected to the printed circuit board through the bonding pin 140. Thus, the signal output by the printed circuit board may be transmitted to the plurality of driver chips 121 through the address signal line DL, and then fed back to the printed circuit board through the output signal line FB, thereby realizing the driving for the plurality of driver chips 121.

In these embodiments, any two adjacent columns of N driver chips in the M columns of N driver chips are electrically connected through the third connecting line 1611; among the M columns of N driver chips, only some columns of N driver chips are electrically connected to the bonding pins 140 located in the bonding region B through the output signal line FB, so that the driving signal can be provided for the multiple columns of driver chips 121. In this way, the number of address signal lines DL that are need to be electrically connected to the bonding pins 140 in the bonding region B is reduced, so that the number of bonding pins 140 that need to be set is reduced. As a result, less bonding regions B are required to provide bonding pins 140, thereby effectively reducing the number of bonding regions B and reducing the space occupied by the bonding region B. Furthermore, in a case where the light-emitting substrate 100 is applied to the display apparatus 1, it is possible to overcome the problem of insufficient space of the display apparatus 1 (e.g., notebook), so that the adaptability of the light-emitting substrate 100 is improved, and the application scenarios of the light-emitting substrate 100 is broaden.

In some embodiments, as shown in FIG. 3C, the third connecting line 1611 extends in the second direction Y, and is located on a side of the functional region F away from the bonding region B.

For example, among the M columns of N driver chips, any two adjacent columns of N driver chips are connected through the third connecting line 1611, so that the M columns of N driver chips are connected in series.

In some examples, in the direction away from the bonding region B, among the M columns of N driver chips, in any two adjacent columns of N driver chips, the address signal line DL connected to the last-stage driver chip 121 of one column of N driver chips is electrically connected to another address signal line DL connected to the last-stage driver chip 121 of another column of N driver chips through a third connecting line 1611.

In still some examples, in the direction away from the bonding region B, among the M columns of N driver chips, in any two adjacent columns of N driver chips, the address signal line DL connected to the first-stage driver chip 121 of one column of N driver chips is electrically connected to another address signal line DL connected to the first-stage driver chip 121 of another column of N driver chips through a third connecting line 1611.

In these embodiments, the M columns of N driver chips are connected through the third connecting lines 1611; and among the M columns of N driver chips, only some columns of N driver chips are electrically connected to bonding pins 140 in the bonding region B through the address signal lines DL, which can reduce the number of the address signal lines DL that need to be electrically connected to the bonding pins 140 in the bonding region B, so that the number of the bonding regions B is reduced.

In some embodiments, as shown in FIG. 4A, the third connecting line 1611 is electrically connected to the first-stage driver chip 121 of one of two adjacent columns of N driver chips, and passes through a gap between the two adjacent columns of functional element groups 120 to be electrically connected to the N-th-stage driver chip 121 of the other of the two adjacent columns of N driver chips.

In some examples, the third connecting line 1611 and the address signal line DL are made of the same material and disposed in the same conductive layer.

For example, the material of the third connecting line 1611 and the material of the address signal line DL may both be metal; for example, the metal may be copper.

For example, the third connecting line 1611 is electrically connected to the address signal line DL to be of a one-piece structure, Thus, the third connecting line 1611 and the address signal lines DL electrically connected thereto may be formed in a single patterning process, thereby simplifying the manufacturing process of the light-emitting substrate 100. In addition, the arrangement of "one-piece structure" can improve the reliability of the electrical connection between the third connecting line 1611 and the address signal line DL, and there is no need to provide other conductive structures, so that the manufacturing cost of the light-emitting substrate 100 is reduced.

In still some examples, the third connecting line 1611 and the address signal line DL may be disposed in different conductive layers. For example, the third connecting line 1611 and the address signal line DL may be respectively disposed on two conductive layers. In this case, the material of the third connecting line 1611 and the material of the 3E address signal line DL may be the same or different, which is not limited in the embodiments of the present disclosure.

In these embodiments, the third connecting line 1611 passes through a gap between two adjacent columns of functional element groups 120 by a routing manner to achieve the electrical connection of two columns of N driver chips. Among the multiple columns of N driver chips connected to the third connecting line 1611, the address signal line DL electrically connected to only some columns of N driver chips is electrically connected to the bonding pin 140 in the bonding region B, so that the driving signal can be provided for the multiple columns of driver chips 121. In this way, the number of address signal lines DL that are need to be electrically connected to the bonding pins 140 in the bonding region B is reduced, so that the number of bonding pins 140 that need to be set is reduced. As a result, the number of bonding regions B is reduced, and the space occupied by the bonding region B is reduced. Furthermore, in a case where the light-emitting substrate 100 is applied to the display apparatus 1, it is possible to overcome the problem of insufficient space of the display apparatus 1 (e.g., notebook), so that the adaptability of the light-emitting substrate 100 is improved, and the application scenarios of the light-emitting substrate 100 is broaden.

In some embodiments, as shown in FIGS. 3A to 3F and FIG. 4A, the second-type signal line 1302 includes a second voltage signal line VL3, and the second voltage signal line VL3 is electrically connected to the driver chip 121.

For example, as shown in FIGS. 3D and 4A, the plurality of second-type connecting lines 160 include at least one fourth connecting line 1612. Among second voltage signal lines VL3 connected to the M columns of N driver chips, at least two second voltage signal lines VL3 are electrically connected through the fourth connecting line 1612.

For example, the signal transmitted by the second voltage signal line VL3 may be a constant voltage signal. The second voltage signal line VL3 is electrically connected to the driver chip 121 to supply power to the driver chip 121.

For example, as shown in FIGS. 3D and 4A, the plurality of second-type connecting lines 160 may include one or more fourth connecting lines 1612.

For example, in a case where the plurality of second-type connecting lines 160 include multiple fourth connecting lines 1612, the number of second voltage signal lines VL1 connected to a same fourth connecting line 1612 may be the same or different, which is not limited in the embodiments of the present disclosure.

For example, the number of second voltage signal lines VL3 connected to the M columns of N driver chips is M; a same fourth connecting line 1612 may be used to connect two second voltage signal lines VL3 in the M second voltage signal lines VL3. Alternatively, a same fourth connecting line 1612 may be used to connect multiple second voltage signal lines VL3 in the M second voltage signal lines VL3. FIGS. 3D and 4A illustrate that the same fourth connecting line 1612 may be used to connect two second voltage signal lines VL3.

For example, as shown in FIGS. 3D and 4A, the second voltage signal lines VL3 are located in the functional region F, one second voltage signal line VL3 is electrically connected to a column of driver chips 121; and among the multiple second voltage signal lines VL3 electrically connected to the same fourth connecting line 1612, at least one second voltage signal line VL3 is spaced apart from the bonding pins 140, and some second voltage signal lines VL3 each extend from the functional region F to the bonding region B and are electrically connected to the respective bonding pin 140 located in the bonding region B through a direct contact manner.

For example, among the multiple second voltage signal lines VL3 connected to the same fourth connecting line 1612, an end of one second voltage signal line VL3 is electrically connected to the bonding pin 140 in the bonding region B, and the other end of the second voltage signal line VL3 extends to the functional region F and is electrically connected to a column of driver chips 121. It can be known from the above that the driver chip 121 is electrically connected to the light-emitting device groups 122, so that the second voltage signal line VL3 may be electrically connected to the light-emitting device groups 122 through the driver chip 121.

In some examples, as shown in FIG. 3D, the driver chip 121 has a power pin VCC. An end of the second voltage signal line VL3 is electrically connected to the power supply outside the light-emitting substrate 100 through the bonding pin 140 and the printed circuit board, and the other end of the second voltage signal line VL3 is electrically connected to the power pin VCC of the driver chip 121, so that the second voltage signal line VL3 can supply power to the driver chip 121.

In still some examples, the fourth connecting lines 1612 and the second voltage signal lines VL3 may be disposed in a same conductive layer.

In still some examples, the fourth connecting lines 1612 and the second voltage signal lines VL3 may be respectively disposed in different conductive layers; for example, the fourth connecting lines 1612 and the second voltage signal lines VL3 may be respectively disposed in two conductive layers. In this case, the material of the fourth connecting line 1612 and the material of the second voltage signal line VL3 may be the same or different, which is not limited in the embodiments of the present disclosure.

In these embodiments, among the second voltage signal lines VL3 electrically connected to the M columns of N driver chips, at least two second voltage signal lines VL3 are electrically connected through the fourth connecting line 1612; among multiple second voltage signal lines VL3 electrically connected to the fourth connecting line 1612, at least one second voltage signal line VL3 is spaced apart from the bonding pins 140, and some second voltage signal lines VL3 are electrically connected to the bonding pins 140 located in the bonding region B through the direct contact manner, so that the power supply to the multiple columns of driver chips is achieved. In this way, the number of the second voltage signal lines VL3 that need to be electrically connected directly to the bonding pins 140 in the bonding region B is reduced, so that the number of bonding pins 140 that needs to be set is reduced. As a result, less bonding regions B are required to provide bonding pins 140, thereby effectively reducing the number of bonding regions B and reducing the space occupied by the bonding regions B. Furthermore, in a case where the light-emitting substrate 100 is applied to the display apparatus 1, it is possible to overcome the problem of insufficient space of the display apparatus 1 (e.g., notebook), so that the adaptability of light-emitting substrate 100 is improved, and the application scenarios of the light-emitting substrate 100 is broadened.

In some embodiments, as shown in FIG. 3D, the fourth connecting line 1612 extends in the second direction Y, and is located on a side (i.e., the lower side of the light-emitting substrate) of the functional region F proximate to the bonding region B.

For example, the fourth connecting line 1612 is electrically connected to the same ends of at least two second voltage signal lines VL3 in the second voltage signal lines VL3 connected to the M columns of N driver chips.

For example, at least two second voltage signal lines VL3 connected to the same fourth connecting line 1612 are arranged in parallel.

For example, the fourth connecting lines 1612 and the second voltage signal lines VL3 may be disposed in different conductive layers; for example, the fourth connecting lines 1612 and the second voltage signal lines VL3 may be respectively disposed in two conductive layers. In this case, the material of the fourth connecting lines 1612 and the material of the second voltage signal line VL3 may be the same or different, which is not limited in the embodiments of the present disclosure.

In these embodiments, the fourth connecting line 1612 extends in the second direction Y, and is electrically connected to the same ends of at least two second voltage signal lines VL3 in the second voltage signal lines VL3 connected to the M columns of N driver chips; among multiple second voltage signal lines VL3 connected to the fourth connecting line 1612, at least one second voltage signal line VL3 is spaced apart from the bonding pins 140, and some second voltage signal lines VL3 are electrically connected to the bonding pins 140 located in the bonding region B through the direct contact manner, so that the power supply to the multiple columns of driver chips is achieved. In this way, the number of the second voltage signal lines VL3 that need to be electrically connected directly to the bonding pins 140 in the bonding region B is reduced, so that the number of bonding pins 140 that needs to be set is reduced. As a result, less bonding regions B are required to provide bonding pins 140, thereby effectively reducing the number of bonding regions B.

For example, as shown in FIG. 4A, the fourth connecting line 1612 is electrically connected to two adjacent second voltage signal lines VL3 in the second voltage signal lines VL3 connected to the M columns of N driver chips. The fourth connecting line 1612 is electrically connected to a first end of one of the two adjacent second voltage signal lines VL3, and passes through a gap between two adjacent columns of functional element groups 120, and is electrically connected to a second end of the other of the two adjacent second voltage signal lines VL3.

For example, two second voltage signal lines VL3 connected to the same fourth connecting line 1612 are arranged in series.

For example, the number of second voltage signal lines VL3 electrically connected to the M columns of N driver chips is M, and the M second voltage signal lines VL3 are connected in series through M−1 fourth connecting lines 1612. For example, as shown in FIG. 4A, two rows and four columns of driver chips are schematically shown in FIG. 4A. The number of second voltage signal lines VL3 connected to the four columns of driver chips is four, and the four second voltage signal lines VL3 are connected in series through three fourth connecting lines 1612.

In some examples, the fourth connecting lines 1612 and the second voltage signal lines VL3 may be disposed in different conductive layers; for example, the fourth connecting lines 1612 and the second voltage signal lines VL3 may be disposed in two conductive layers respectively. In this case, the material of the fourth connecting lines 1612 and the material of the second voltage signal lines VL3 may be the same or different, which is not limited in the embodiments of the present disclosure.

In some other examples, the fourth connecting lines 1612 and the second voltage signal lines VL3 are made of the same material and disposed in the same layer, i.e., disposed in the same conductive layer.

For example, the material of the fourth connecting line 1612 and the material of the second voltage signal line VL3 may both be metal; for example, the metal may be copper.

For example, the fourth connecting line 1612 is electrically connected to the second voltage signal lines VL3 to be of a one-piece structure. Thus, the fourth connecting line 1612 and the second voltage signal lines VL3 electrically connected thereto may be formed in a single patterning process, thereby simplifying the manufacturing process of the light-emitting substrate 100. In addition, the arrangement of "one-piece structure" can improve the reliability of the electrical connection between the fourth connecting line 1612 and the second voltage signal line VL3, and there is no need to provide other conductive structures, so that the manufacturing cost of the light-emitting substrate 100 is reduced.

It can be understood that the "first end" and the "second end" that are mentioned above are relative terms. For example, the first end of the second voltage signal line VL3 refers to the end of the second voltage signal line VL3 away from the bonding region B, and the second end of the second voltage signal line VL3 refers to the end of the second voltage signal line VL3 proximate to the bonding region B. Alternatively, the first end of the second voltage signal line VL3 refers to the end of the second voltage signal line VL3 proximate to the bonding region B, and the second end of the second voltage signal line VL3 refers to the end of the second voltage signal line VL3 away from the bonding region B.

In these embodiments, the fourth connecting line 1612 passes through a gap between two adjacent columns of functional element groups 120 by a routing manner to achieve the electrical connection of two adjacent second voltage signal lines VL3 in the second voltage signal lines VL3 connected to the M columns of N driver chips; among the second voltage signal lines VL3 electrically connected to the M columns of N driver chips, at least one second voltage signal line VL3 is spaced apart from the bonding pins 140, and some second voltage signal lines VL3 are electrically connected to the bonding pins 140 located in the bonding region B through the direct contact manner, so that the power supply to the multiple columns of driver chips is achieved. In this way, the number of the second voltage signal lines VL3 that need to be electrically connected directly to the bonding pins 140 in the bonding region B is reduced, so that the number of bonding pins 140 that needs to be set is reduced. As a result, the number of bonding regions B is reduced, and the space occupied by the bonding regions B is reduced. Furthermore, in a case where the light-emitting substrate 100 is applied to the display apparatus 1, it is possible to overcome the problem of insufficient space of the display apparatus 1 (e.g., notebook), so that the adaptability of light-emitting substrate 100 is improved, and the application scenarios of the light-emitting substrate 100 is broadened.

On this basis, the fourth connecting lines 1612 and the second voltage signal lines VL3 may be disposed in the same conductive layer, or may be disposed in different conductive layers, so as to realize the flexible wiring of the light-emitting substrate 100. In a case where the fourth connecting lines 1612 and the second voltage signal lines VL3 are disposed in the same conductive layer, the steps of patterning the conductive layer may be reduced, thereby simplifying the manufacturing process of the light-emitting substrate 100, reducing the number of masks, and reducing the cost of the light-emitting substrate 100. Moreover, it is also possible to reduce the occurrence of defective failures such as short circuit of the light-emitting substrate 100, so that the yield of the light-emitting substrate 100 is improved.

In some embodiments, as shown in FIGS. 3E and 4A, the second-type signal lines 1302 include data signal lines VL4, and the data signal lines VL4 are electrically connected to the respective driver chips 121. The plurality of second-type connecting lines 160 includes at least one fifth connecting line 1613. Among data signal lines VL4 connected to the M columns of N driving chips, at least two data signal lines VL4 are electrically connected through the fifth connecting line 1613.

For example, the data signal line VL4 is used to transmit a data signal.

For example, as shown in FIGS. 3E and 4A, the plurality of second-type connecting lines 160 may include one or more fifth connecting lines 1613.

For example, in a case where the plurality of second-type connecting lines 160 include multiple fifth connecting lines 1613, the number of data signal lines VL4 connected to a same fifth connecting line 1613 may be the same or different, which is not limited in the embodiments of the present disclosure. For example, as shown in FIGS. 3E and 4A, the same fifth connecting line 1613 may be used to connect two data signal lines VL4.

For example, the number of data signal lines VL4 connected to the M columns of N driver chips is M, and a same fifth connecting line 1613 may be used to connect two data signal lines VL4 in the M data signal lines VL4. Alternatively, a same fifth connecting line 1613 may be used to connect multiple data signal lines VL4 in the M data signal lines VL4. FIGS. 3E and 4A illustrate that a same fourth connecting line 1612 may be used to connect two data signal lines VL4.

For example, as shown in FIGS. 3E and 4A, the data signal lines VL4 are located in the functional region F, one data signal line VL4 is electrically connected to a column of driver chips 121; and among the multiple data signal lines VL4 electrically connected to the same fifth connecting line 1613, at least one data signal line VL4 is spaced apart from the bonding pins 140, and some data signal lines VL4 each extend from the functional region F to the bonding region B and are electrically connected to the respective bonding pins 140 located in the bonding region B.

For example, among the multiple data signal lines VL4 connected to the same fifth connecting line 1613, an end of one data signal line VL4 is electrically connected to the bonding pin 140 in the bonding region B, and the other end of the data signal line VL4 extends to the functional region F and is electrically connected to a column of driver chips 121. It can be known from the above that the driver chip 121 is electrically connected to the light-emitting device groups 122, so that the data signal line VL4 may be electrically connected to the light-emitting device groups 122 through the driver chip 121.

In some examples, as shown in FIG. 3E, the driver chip 121 has a data pin Dip. An end of the data signal line VL4 is electrically connected to the printed circuit board through the bonding pin 140, and the other end of the data signal line VL4 is electrically connected to the data pin Dip of the driver chip 121 (one or more).

In some examples, as shown in FIG. 4A, the driver chip 121 has two data terminals Data. One of the two data terminals Data is a data input terminal, and the other of the two data terminals Data is a data output terminal. In this case, the data signal line VL4 may include multiple data signal sub-lines. The data signal sub-line is used to connect two adjacent driver chips 121. An end of the data signal sub-line is electrically connected to the data output terminal of one of the two adjacent driver chips 121, and the other end of the data signal sub-line is electrically connected to the data input terminal of the other of the two adjacent driver chips 121.

In some examples, the fifth connecting lines 1613 and the data signal lines VL4 may be disposed in a same conductive layer.

In still some examples, the fifth connecting line 1613 and the data signal lines VL4 may be disposed in different conductive layers. For example, the fifth connecting lines 1613 and the data signal lines VL4 may be respectively disposed in two conductive layers. In this case, the material of the fifth connecting line 1613 and the material of the data signal line VL4 may be the same or different, which is not limited in the embodiments of the present disclosure.

In these embodiments, among the data signal lines VL4 electrically connected to the M columns of N driver chips, at least two data signal lines VL4 are electrically connected through the fifth connecting line 1613; among multiple data signal lines VL4 electrically connected to the fifth connecting line 1613, at least one data signal line VL4 is spaced apart from the bonding pins 140, and some data signal lines VL4 are electrically connected to the bonding pins 140 located in the bonding region B through the direct contact manner, so that it is possible to provide the data signals for the multiple columns of driver chips. In this way, the number of the data signal lines VL4 that need to be electrically connected directly to the bonding pins 140 in the bonding region B is reduced, so that the number of bonding pins 140 that needs to be set is reduced. As a result, less bonding regions B are required to provide bonding pins 140, thereby effectively reducing the number of bonding regions B and reducing the space occupied by the bonding regions B. Furthermore, in a case where the light-emitting substrate 100 is applied to the display apparatus 1, it is possible to overcome the problem of insufficient space of the display apparatus 1 (e.g., notebook), so that the adaptability of light-emitting substrate 100 is improved, and the application scenarios of the light-emitting substrate 100 is broadened.

In some embodiments, as shown in FIG. 3E, the fifth connecting line 1613 extends in the second direction Y, and is located on a side of the functional region F away from the bonding region B.

For example, the fifth connecting line 1613 is electrically connected to the same ends of at least two data signal lines VL4 in the data signal lines VL4 connected to the M columns of N driver chips.

For example, the same fifth connecting line 1613 is used to connect two data signal lines VL4, and the fifth connecting line 1613 and the two data signal lines VL4 connected to the fifth connecting line 1613 are S-shaped as a whole.

For example, the multiple data signal lines VL4 connected to the same fifth connecting line 1613 are arranged in parallel.

In these embodiments, the fifth connecting line 1613 extends in the second direction Y and is electrically connected to the same ends of the at least two data signal lines VL4 in the data signal lines VL4 connected to the M columns of N driver chips; among the multiple data signal lines VL4 connected to the fifth connecting line 1613, at least one data signal line VL4 is spaced apart from the bonding pins 140, and only some data signal lines VL4 are electrically connected to the bonding pins 140 located in the bonding region B through the direct contact manner, so that the number of the data signal lines VL4 that need to be electrically connected directly to the bonding pins 140 in the bonding region B is reduced, and thus the number of the bonding regions B is reduced.

For example, as shown in FIG. 4A, the fifth connecting line 1613 is electrically connected to two adjacent data signal lines VL4 in the data signal lines VL4 connected to the M columns of N driver chips. The fifth connecting line 1613 is electrically connected to a first end of one of the two adjacent data signal lines VL4, and passes through a gap between two adjacent columns of functional element groups 120, and is electrically connected to a second end of the other of the two adjacent data signal lines VL4.

For example, two data signal lines VL4 connected to a same fifth connecting line 1613 are arranged in series.

For example, the number of data signal lines VL4 connected to the M columns of N driver chips is M, and the M data signal lines VL4 are connected in series through M−1 data signal lines VL4, For example, as shown in FIG. 4A, two rows and four columns of driver chips are schematically shown in FIG. 4A. The number of data signal lines VL4 connected to the four columns of driver chips is four, and the four data signal lines VL4 are connected in series through three fifth connecting lines 1613.

In some examples, the fifth connecting lines 1613 and the data signal lines VL4 may be disposed in different conductive layers; for example, the fifth connecting lines 1613 and the data signal lines VL4 may be disposed in two conductive layers respectively. In this case, the material of the fifth connecting line 1613 and the material of the data signal line VL4 may be the same or different, which is not limited in the embodiments of the present disclosure.

In some other examples, the fifth connecting lines 1613 and the data signal lines VL4 are made of the same material and disposed in a same layer, i.e., disposed in a same conductive layer, as shown in FIG. 4A.

For example, the material of the fifth connecting lines 1613 and the material of the data signal lines VL4 may both be metal; for example, the metal may be copper.

For example, the fifth connecting line 1613 is electrically connected to the data signal lines VL4 to be of a one-piece structure. Thus, the fifth connecting line 1613 and the data signal lines VL4 electrically connected thereto are formed in a single patterning process, thereby simplifying the manufacturing process of the light-emitting substrate 100. In addition, the arrangement of "one-piece structure" may improve the reliability of the electrical connection between the fifth connecting line 1613 and the data signal lines VL4, and there is no need to provide other conductive structures, so that the manufacturing cost of the light-emitting substrate 100 is reduced.

In these embodiments, the fifth connecting line 1613 passes through a gap between two adjacent columns of functional element groups 120 by a routing manner to achieve the electrical connection of two adjacent data signal lines VL4 in the data signal lines VL4 connected to the M columns of N driver chips. Among the multiple data signal lines VL4 connected to the M columns of N driver chips, at least one data signal line VL4 is spaced apart from the bonding pins 140, and some data signal lines VL4 are electrically connected to the bonding pin 140 in the bonding region B through a direct contact manner, so as to provide data signals for the multiple driver chips 121, so that the number of data signal lines VL4 that are need to be electrically connected to the bonding pins 140 in the bonding region B is reduced. Thus, the number of bonding pins 140 that need to be set is reduced, so that the number of bonding regions B is reduced, and the space occupied by the bonding region B is reduced. Furthermore, in a case where the light-emitting substrate 100 is applied to the display apparatus 1, it is possible to overcome the problem of insufficient space of the display apparatus 1 (e.g., notebook), so that the adaptability of the light-emitting substrate 100 is improved, and the application scenarios of the light-emitting substrate 100 is broaden.

On this basis, the fifth connecting lines 1613 and the data signal lines VL4 may be disposed in the same conductive layer, or may be disposed in different conductive layers, so as to realize the flexible wiring of the light-emitting substrate 100. In a case where the fifth connecting lines 1613 and the data signal lines VL4 are disposed in the same conductive layer, the steps of patterning the conductive layer may be reduced, thereby simplifying the manufacturing process of the light-emitting substrate 100, reducing the number of masks, and reducing the cost of the light-emitting substrate 100. Moreover, it is also possible to reduce the occurrence of defective failures such as short circuit of the light-emitting substrate 100, so that the yield of the light-emitting substrate 100 is improved.

Hereinafter, it will be described by taking an example in which the M columns of N driver chips arranged in series.

For example, multiple light-emitting device groups 122 in a same column of functional element groups 120 are arranged in n columns in the second direction Y, that is, each column of driving chips 121 controls n columns of light-emitting device groups 122, and the number of columns of light-emitting device groups 122 controlled by the M columns of N driver chip is M×n, and M×n first voltage signal lines VL1 connected to the M×n columns of light-emitting device groups 122 are connected in parallel.

For example, as shown in FIG. 3A, each column of driver chips 121 controls two columns of light-emitting device groups 122, and two columns of N driver chips are connected in series through a third connecting line 1611, and the two columns of N driver chips control four columns of light-emitting device groups 122. In this case, the four first voltage signal lines VL1 connected to the four columns of light-emitting device groups 122 are connected in parallel.

For another example, as shown in FIG. 4A, each column of driver chips 121 controls one column of light-emitting device groups 122, and four columns of N driver chips are connected in series through a third connecting line 1611, and the four columns of N driver chips control four columns of light-emitting device groups 122. In this case, the four first voltage signal lines VL1 connected to the four columns of light-emitting device groups 122 are connected in parallel.

For example, a column of N driver chips is connected to a second voltage signal line VL3, and the M second voltage signal lines VL3 connected to the M columns of N driver chips are arranged in parallel.

For example, as shown in FIG. 3D, two columns of N driver chips are connected in series through the third connecting line 1611, and two second voltage signal lines VL3 connected to the two columns of N driver chips are connected in parallel.

For example, a column of N driver chips is connected to a second voltage signal line VL3, and M second voltage signal lines VL3 connected to the M columns of N driver chips are connected in series.

For example, as shown in FIG. 4A, four columns of N driver chips are connected in series through the third connecting lines 1611, and four second voltage signal lines VL3 connected to the four columns of N driver chips are connected in series.

For example, a column of N driver chips is connected to a ground signal line VL2, and M ground signal lines VL2 connected to the M columns of N driver chips are connected in parallel.

For example, as shown in FIG. 3C, two columns of N driver chips are connected in series through the third connecting line 1611, and two ground signal lines VL2 connected to the two columns of N driver chips are connected in parallel.

For another example, as shown in FIG. 4A, four columns of N driver chips are connected in series through the third connecting lines 1611, and four ground signal lines VL2 connected to the four columns of N driver chips are connected in parallel.

For example, a column of N driver chips is connected to a data signal line VL4, the M data signal lines VL4 connected to the M columns of N driver chips are connected in series, and any two data signal lines VL4 in the M data signal lines VL4 and the fifth connecting line 1613 connecting the any two data signal lines VL4 are S-shaped as a whole, as shown in FIG. 4A.

In some embodiments of the present disclosure, the plurality of first-type connecting lines 150 may include both first connecting lines 1511 and second connecting lines 1512; the plurality of second-type connecting lines 160 may include one or more of third connecting lines 1611, fourth connecting lines 1612 and fifth connecting lines 1613. Various combinations and variations based on the above description, which are not described in details here, and do not depart from the principle of the present disclosure.

For example, as shown in FIGS. 3F and 4A, the plurality of first-type connecting lines 150 include both first connecting lines 1511 and second connecting lines 1512, and the plurality of second-type connecting lines 160 may include third connecting lines 1611 fourth connecting lines 1612 and fifth connecting lines 1613.

It will be understood that, the more the number of the first connecting lines 1511 and second connecting lines 1512 included in the plurality of first-type connecting lines 150, and the third connecting lines 1611, fourth connecting lines 1612 and fifth connecting lines 1613 included in the plurality of second-type connecting lines 160, the more the number of bonding pins 140 can be reduced, and the less the number of bonding regions B.

For example, considering four columns of functional element groups 120 as an example for illustration.

As shown in FIG. 6, in a case where the power signal line VLED, the chip power signal line VCC, the input signal line Dis, the data signal line Data, the ground signal line GND, and the output signal line FB in each signal line group 130 are respectively electrically connected to different bonding pins 140, the power signal lines VLED, chip power signal lines VCC, input signal lines Dis, data signal lines Data, ground signal lines GND, output signal lines FB in the signal line groups 130 in the four columns of functional element groups 120 are respectively electrically connected to different bonding pins 140, In this case, the number of bonding pins connected to the signal line groups 130 in the four columns of functional element group 120 is 24.

As shown in FIG. 4A, the plurality of first-type connecting lines 150 may include first connecting lines 1511 and second connecting lines 1512, and the plurality of second-type connecting lines 160 may include third connecting lines 1611, fourth connecting lines 1612 and fifth connecting lines 1613. Among the four first voltage signal lines VL1 connected to the first connecting line 1511, only one first voltage signal line VL1 is electrically connected to the bonding pin 140; among the four ground signal lines VL2 connected to the second connecting line 1512, only one ground signal line VL2 is electrically connected to the bonding pin 140; among the four second voltage signal lines VL3 connected to the fourth connecting line 1612, only one second voltage signal line is electrically connected to the bonding pin 140; among the four data signal lines VL4 connected to the fifth connecting line 1613, only one data signal line VL4 is electrically connected to the bonding pin 140. Among the four columns of N driver chips, the address signal line DL connected to the first-stage driver chip 121 of one column of N driver chips extends from the functional region F to the bonding region B, and is electrically connected to the bonding pin 140 located in the bonding region B; an end of another column of N driver chips is electrically connected to the third connecting line 1611, and the other end is electrically connected to the output signal line FB; the output signal line FB extends from the functional region F to the bonding region B, and is electrically connected to the bonding pin 140 located in the bonding region B. In this case, the number of bonding pins connected to the signal line groups 130 in the four columns of functional element groups 120 is 6. Obviously, the number of bonding pins 140 that need to be set is reduced.

In summary, the light-emitting substrate 100 provided by the embodiments of the present disclosure, the first-type signal lines 1301 that transmit the same signal in at least two signal line groups 130 are connected by the first-type connecting line 150; among the multiple first-type signal lines 1301 electrically connected to the first-type connecting line 150, only some first-type signal lines 1301 are electrically connected to the bonding pins 140, which reduces the number of first-type signal lines 1301 that need to be electrically connected to the bonding pins 140, so that the number of bonding pins 140 that need to be set is reduced. As a result, less bonding regions B are required to provide bonding pins 140, thereby effectively reducing the number of bonding regions B, and meeting the needs of narrow border design of some products.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate, having a functional region and a bonding region spaced apart in a first direction; the light-emitting substrate comprising:

a substrate;

a plurality of functional element groups located on a side of the substrate and located in the functional region; wherein the plurality of functional element groups are arranged in a plurality of rows in the first direction and in a plurality of columns in a second direction; the first direction intersects with the second direction;

a plurality of signal line groups located in the functional region and located on a same side of the substrate as the plurality of functional element groups, wherein a signal line group is electrically connected to a column of functional element groups; the signal line group includes at least one first-type signal line, all first-type signal lines each extend in the first direction and are arranged at intervals in the second direction;

a plurality of first-type connecting lines, wherein a first-type connecting line is used to connect first-type signal lines transmitting a same signal in at least two signal line groups; and a plurality of bonding pins located in the bonding region;

wherein among the first-type signal lines electrically connected to the first-type connecting line, at least one first-type signal line is spaced apart from the bonding pins;

a functional element group includes at least one light-emitting device group and a driver chip; and multiple driver chips in a same column of functional element groups are arranged in a column in the first direction, wherein multiple light-emitting device groups in the same column of functional element groups are located on two opposite sides, in the second direction, of the multiple driver chips in the same column of functional element groups;

the at least one first-type signal line included in the signal line group includes at least one first voltage signal line, and the at least one first voltage signal line is electrically connected to the at least one light-emitting device group; and the plurality of first-type connecting lines include at least one first connecting line; wherein a first connecting line of the at least one first connecting line is electrically connected to the same ends of first voltage signal lines in at least two signal line groups.

2. The light-emitting substrate according to claim 1, wherein the first connecting line extends in the second direction and is located on a side of the functional region away from the bonding region.

3. The light-emitting substrate according to claim 1, wherein the multiple light-emitting device groups in the same column of functional element groups are arranged in at least one column;

a column of light-emitting device groups are electrically connected to a first voltage signal line of the at least one first voltage signal line.

4. The light-emitting substrate according to claim 3, wherein an orthogonal projection, on the substrate, of the column of light-emitting device groups electrically connected to the first voltage signal line at least partially overlaps with an orthogonal projection, on the substrate, of the first voltage signal line.

5. The light-emitting substrate according to claim 1, wherein the at least one first-type signal line included in the signal line group further includes a ground signal line, and the ground signal line is electrically connected to the driver chip; and the plurality of first-type connecting lines further include at least one second connecting line; wherein a second connecting line of the at least one second connecting line is electrically connected to the same ends of ground signal lines in at least two signal line groups.

6. The light-emitting substrate according to claim 5, wherein the second connecting line extends in the second direction and is located on a side of the functional region proximate to the bonding region.

7. The light-emitting substrate according to claim 1, wherein each functional element group includes the driver chip, the number of functional element groups in each column is N, and N driver chips in each column of functional element groups are cascaded in sequence; the signal line group further includes at least one second-type signal line, all second-type signal lines each extend in the first direction and are arranged at intervals in the second direction;

the light-emitting substrate further comprises: a plurality of second-type connecting lines, wherein a second-type connecting line is used to connect second-type signal lines transmitting a same signal in at least two signal line groups;

wherein among the second-type signal lines electrically connected to the second-type connecting line, at least one second-type signal line is spaced apart from the bonding pins.

8. A light-emitting substrate, having a functional region and a bonding region spaced apart in a first direction; the light-emitting substrate comprising:

a substrate;

a plurality of functional element groups located on a side of the substrate and located in the functional region; wherein the plurality of functional element groups are arranged in a plurality of rows in the first direction and in a plurality of columns in a second direction; the first direction intersects with the second direction;

a plurality of signal line groups located in the functional region and located on a same side of the substrate as the plurality of functional element groups, wherein a signal line group is electrically connected to a column of functional element groups; the signal line group includes at least one first-type signal line, all first-type signal lines each extend in the first direction and are arranged at intervals in the second direction;

a plurality of first-type connecting lines, wherein a first-type connecting line is used to connect first-type signal lines transmitting a same signal in at least two signal line groups; and a plurality of bonding pins located in the bonding region;

wherein among the first-type signal lines electrically connected to the first-type connecting line, at least one first-type signal line is spaced apart from the bonding pins;

each functional element group includes a driver chip, the number of functional element groups in each column is N, and N driver chips in each column of functional element groups are cascaded in sequence; the signal line group further includes at least one second-type signal line, all second-type signal lines each extend in the first direction and are arranged at intervals in the second direction; and the light-emitting substrate further comprises: a plurality of second-type connecting lines, wherein a second-type connecting line is used to connect second-type signal lines transmitting a same signal in at least two signal line groups;

wherein among the second-type signal lines electrically connected to the second-type connecting line, at least one second-type signal line is spaced apart from the bonding pins.

9. The light-emitting substrate according to claim 8, wherein all the second-type signal lines include multiple address signal lines, and any two adjacent driver chips of the N drive chips are cascaded through an address signal line; and the plurality of second-type connecting lines include at least one third connecting line; wherein in M columns of functional element groups, two driver chips respectively belonging to two adjacent columns of functional element groups are cascaded through a third connecting line of the at least one third connecting line, wherein $M \geq 2$, and M is a positive integer.

10. The light-emitting substrate according to claim 9, wherein the third connecting line is electrically connected to a first driver chip of one of two adjacent columns of N driver chips, and passes through a gap between the two adjacent columns of functional element groups to be electrically connected to an N-th driver chip of another of the two adjacent columns of N driver chips; and/or the third connecting line extends in the second direction and is located on a side of the functional region away from the bonding region.

11. The light-emitting substrate according to claim 9, wherein all the second-type signal lines further include multiple second voltage signal lines, and a second voltage signal line is electrically connected to the driver chip;

the plurality of second-type connecting lines further include at least one fourth connecting line;

among second voltage signal lines connected to M columns of N driver chips, at least two second voltage signal lines are connected through a fourth connecting line of the at least one fourth connecting line.

12. The light-emitting substrate according to claim 11, wherein the fourth connecting line extends in the second direction and is located on a side of the functional region proximate to the bonding region.

13. The light-emitting substrate according to claim 11, wherein the fourth connecting line is connected to two adjacent second voltage signal lines in the second voltage signal lines connected to the M columns of N driver chips;

wherein the fourth connecting line is electrically connected to a first end of one of the two adjacent second voltage signal lines, and passes through a gap between the two adjacent columns of functional element groups to be electrically connected to a second end of another of the two adjacent second voltage signal lines.

14. The light-emitting substrate according to claim 9, wherein all the second-type signal lines further include multiple data signal lines, and a data signal line is electrically connected to the driver chip;

the plurality of second-type connecting lines further include at least one fifth connecting line; wherein among data signal lines connected to M columns of N driver chips, at least two data signal lines are connected through a fifth connecting line of the at least one fifth connecting line.

15. The light-emitting substrate according to claim 14, wherein the fifth connecting line extends in the second direction and is located on a side of the functional region proximate to the bonding region.

16. The light-emitting substrate according to claim 14, the fifth connecting line is electrically connected to two adjacent data signal lines in the data signal lines connected to the M columns of N driver chips;

wherein the fifth connecting line is electrically connected to a first end of one of the two adjacent data signal lines, and passes through a gap between the two adjacent columns of functional element groups to be electrically connected to a second end of another of the two adjacent data signal lines.

17. The light-emitting substrate according to claim 1, wherein each functional element group includes at least one light-emitting device group, a light-emitting device group of the at least one light-emitting device group includes a plurality of light-emitting devices;

light-emitting devices included in multiple light-emitting device groups are arranged in a plurality of rows in the first direction, and arranged in a plurality of columns in the second direction; wherein any two adjacent rows of light-emitting devices are arranged in a staggered manner.

18. A backlight module, comprising:

the light-emitting substrate according to claim 1; and an optical film located on a light exit side of the light-emitting substrate.

19. A display apparatus, comprising:

the backlight module according to claim 18;

an array substrate located on a light exit side of the backlight module; and a color filter substrate located on a side of the array substrate away from the backlight module.

20. The light-emitting substrate according to claim 6, wherein each functional element group includes the driver chip, the number of functional element groups in each column is N, and N driver chips in each column of functional element groups are cascaded in sequence; the signal line group further includes at least one second-type signal line, all second-type signal lines each extend in the first direction and are arranged at intervals in the second direction;

the light-emitting substrate further comprises: a plurality of second-type connecting lines, wherein a second-type connecting line is used to connect second-type signal lines transmitting a same signal in at least two signal line groups;

wherein among the second-type signal lines electrically connected to the second-type connecting line, at least one second-type signal line is spaced apart from the bonding pins.

* * * * *